US011024511B1

(12) United States Patent
Chen

(10) Patent No.: US 11,024,511 B1
(45) Date of Patent: Jun. 1, 2021

(54) PATTERNING METHOD

(71) Applicant: Winbond Electronics Corp., Taichung (TW)

(72) Inventor: Frederick Chen, San Jose, CA (US)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/853,766

(22) Filed: Apr. 21, 2020

(51) Int. Cl.
| | |
|---|---|
| *H01L 21/308* | (2006.01) |
| *H01L 21/027* | (2006.01) |
| *H01L 21/311* | (2006.01) |
| *H01L 21/033* | (2006.01) |
| *H01L 21/768* | (2006.01) |
| *H01L 21/3213* | (2006.01) |
| *H01L 29/66* | (2006.01) |

(52) U.S. Cl.
CPC ...... *H01L 21/3086* (2013.01); *H01L 21/0274* (2013.01); *H01L 21/0332* (2013.01); *H01L 21/0335* (2013.01); *H01L 21/0337* (2013.01); *H01L 21/0338* (2013.01); *H01L 21/3081* (2013.01); *H01L 21/3085* (2013.01); *H01L 21/3088* (2013.01); *H01L 21/311* (2013.01); *H01L 21/31122* (2013.01); *H01L 21/31144* (2013.01); *H01L 21/32137* (2013.01); *H01L 21/76877* (2013.01); *H01L 29/6656* (2013.01)

(58) Field of Classification Search
None
See application file for complete search history.

(56) References Cited

U.S. PATENT DOCUMENTS

| | | | |
|---|---|---|---|
| 7,807,575 B2 | 10/2010 | Zhou | |
| 2014/0256140 A1* | 9/2014 | Sipani | H01L 21/0337 438/703 |
| 2015/0243518 A1 | 8/2015 | deVilliers | |
| 2017/0140986 A1 | 5/2017 | Machkaoutsan et al. | |
| 2017/0221902 A1 | 8/2017 | Kang | |
| 2019/0096666 A1* | 3/2019 | Zhou | H01L 21/0337 |

* cited by examiner

*Primary Examiner* — Jiong-Ping Lu
(74) *Attorney, Agent, or Firm* — JCIPRNET

(57) ABSTRACT

Provided is a patterning method including: providing a strip layer with a plurality of strips A, in combination with a plurality of strips B and strips C arranged alternately between the strips A; forming a first mask layer having a first opening on the strip layer; removing the strips A and B exposed by the first opening; forming a plurality of first spacers on sidewalls defined by the first opening; forming a plurality of second spacers on sidewalls of the first spacers respectively; forming a second mask layer having a second opening on the strip layer; removing the strips A and C exposed by the second opening; forming a plurality of third spacers defined by the second opening; forming a plurality of fourth spacers on sidewalls of the third spacers respectively; and removing the strips A, the first spacers, and the third spacers to form a pattern layer.

20 Claims, 27 Drawing Sheets

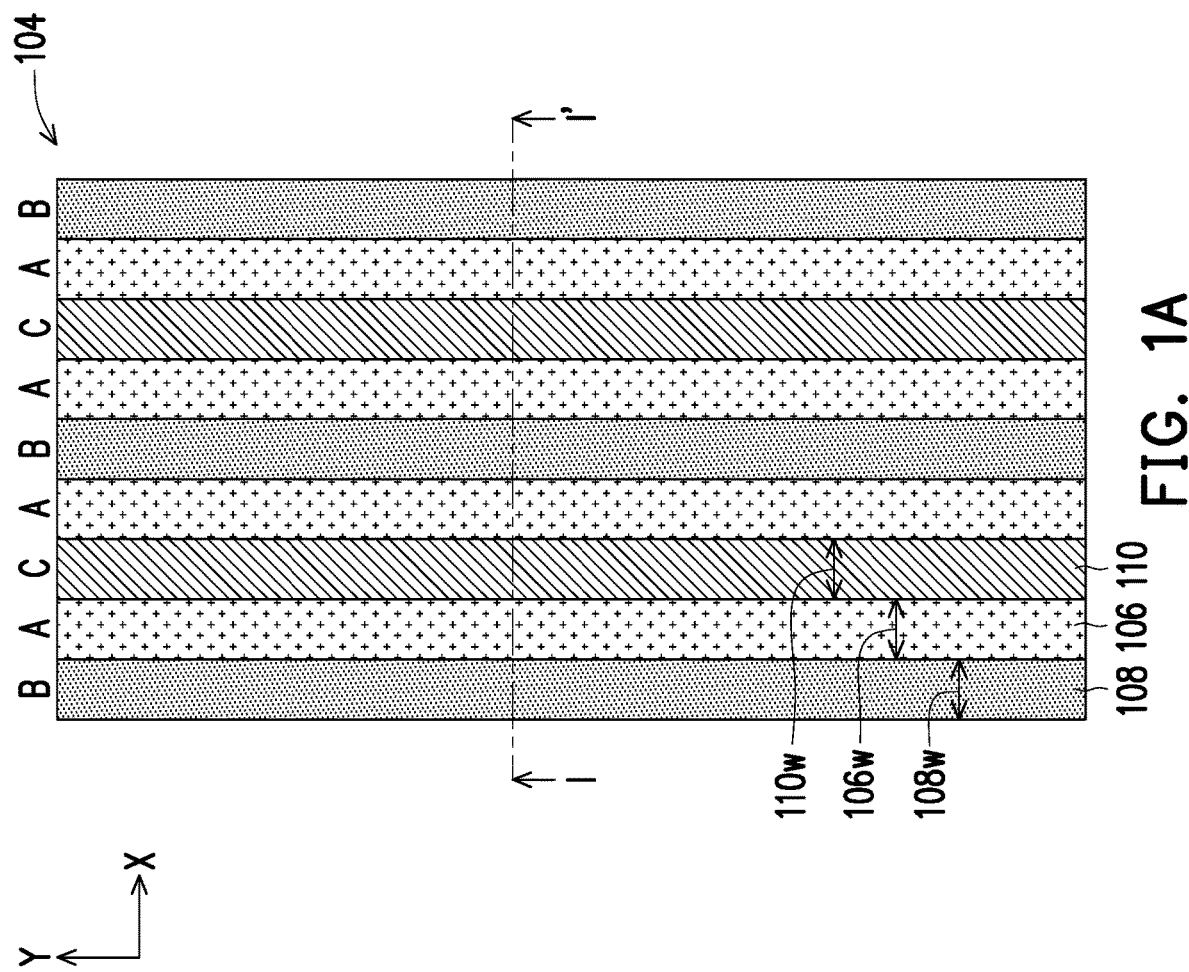

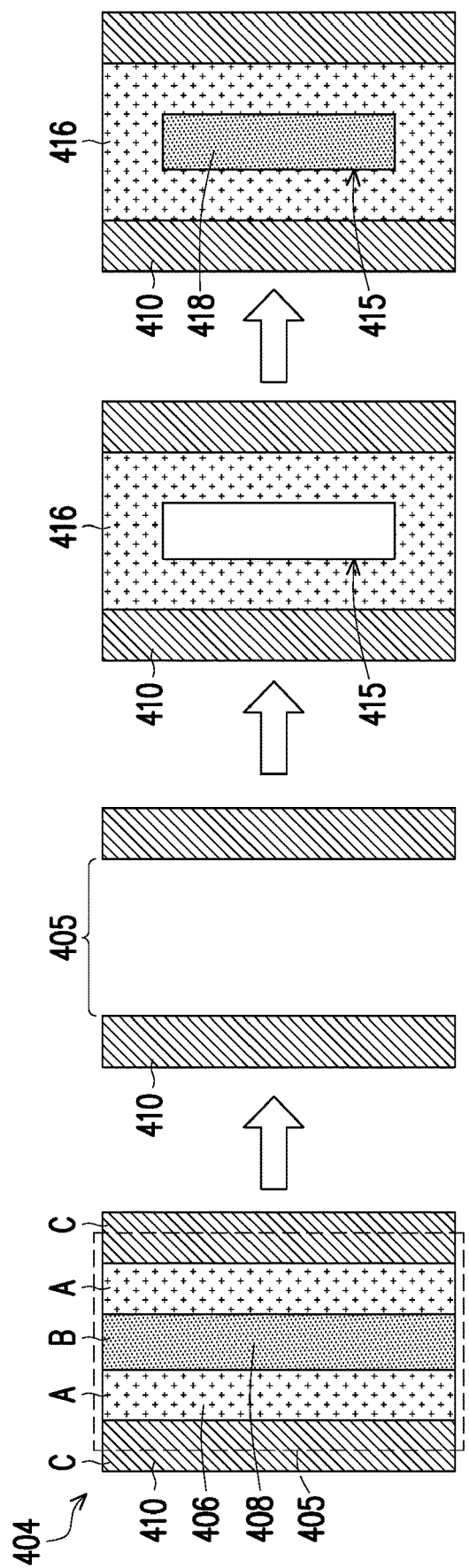

PATTERNING METHOD

BACKGROUND OF THE INVENTION

Field of the Invention

The present invention relates to a patterning method.

Description of Related Art

With the progress of science and technology, all kinds of electronic products tend to be light, thin, and small. In this trend, a critical size of the semiconductor device has also been gradually reduced, which has made the lithography process more and more difficult. In a conventional lithography process, the method of shrinking the critical size includes using higher numerical aperture (NA) optics, shorter exposure wavelengths (e.g., EUV), or interfacial media other than air (e.g., water immersion). As these options for improving the resolution of the conventional lithography process have approached optical and/or stochastic limits, manufacturers have started to turn to double-patterning (DP) or even quadruple-patterning (QP) methods to overcome optical limitations, thereby increasing the integration density of the semiconductor device.

SUMMARY OF THE INVENTION

The invention provides a patterning method, which generates a high-resolution feature by removing two strips with different materials in a specific area and a double-patterning process, thereby enhancing the integration density of a semiconductor device.

The invention provides a patterning method including: sequentially forming a hard mask layer and a strip layer on a target layer, wherein the strip layer comprises a plurality of strips A, in combination with a plurality of strips B and strips C arranged alternately between the strips A; forming a first mask layer having a first opening on the strip layer; removing the strips A and B exposed by the first opening; after removing the first mask layer, forming a plurality of first spacers on sidewalls of the strips C respectively; forming a plurality of second spacers on sidewalls of the first spacers respectively; forming a second mask layer having a second opening on the strip layer; removing the strips A and C exposed by the second opening; after removing the second mask layer, forming a plurality of third spacers on the strips B respectively; forming a plurality of fourth spacers on sidewalls of the third spacers respectively; and removing the strips A, the first spacers, and the third spacers to form a pattern layer that exposes a top surface of the hard mask layer.

The invention provides a patterning method including: providing a strip layer, wherein the strip layer comprises a plurality of strips A, in combination with a plurality of strips B and strips C arranged alternately between the strips A; forming a first mask layer having a first opening on the strip layer, wherein the first opening is donut-shaped; removing the strips A and C exposed by the first opening; forming a plurality of first spacers on sidewalls of the first opening and strips B respectively; forming a plurality of second spacers on sidewalls of the first spacers respectively; after removing the first mask layer, forming a second mask layer having a second opening on the strip layer, wherein the second opening is donut-shaped; removing the strips A and B exposed by the second opening; forming a plurality of third spacers on sidewalls of the second opening and strips C respectively; forming a plurality of fourth spacers on sidewalls of the third spacers respectively; and after removing the second mask layer, removing the strips A, the first spacers, and the third spacers to form a pattern layer.

The invention provides a patterning method including: forming a core layer on a target layer, wherein the core layer comprises a plurality of first pillar structures arranged in a matrix configuration; forming a spacer on sidewalls of the first pillar structures to form a plurality of first holes between the first pillar structures; filling the first holes with a first material to form a plurality of second pillar structures; forming a mask layer with an opening on the core layer; removing the first or second pillar structures exposed by the opening to form a plurality of second holes; and filling the second holes with a second material to form a plurality of third pillar structures.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1I are schematic top views of a manufacturing process of a semiconductor structure according to a first embodiment of the invention.

FIG. 11A to FIG. 11D are schematic top views of a manufacturing process of a semiconductor structure according to a sixth embodiment of the invention.

DESCRIPTION OF THE EMBODIMENTS

Figure 1C:
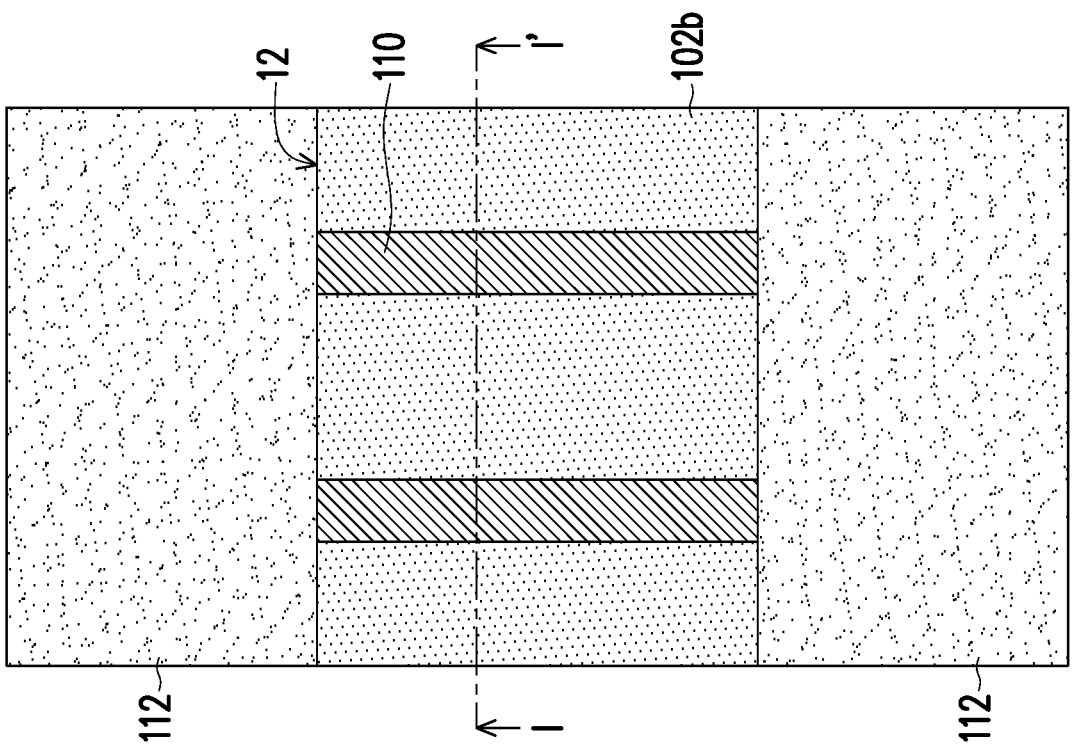

The patterning method illustrated in the following embodiments may be regarded as a method of manufacturing a semiconductor structure. The semiconductor structure may be the active areas of a dynamic random access memory (DRAM), but the invention is not limited thereto. In other embodiments, the semiconductor structure may be landing pads or capacitor contact structures of a DRAM, an interconnect structure of a logic device, or a combination thereof.

FIG. 1A to FIG. 1I are schematic top views of a manufacturing process of a semiconductor structure according to a first embodiment of the invention. FIG. 2A to FIG. 2B are schematic cross-sectional views taken along line I-I' of FIG. 1A and FIG. 1C. FIG. 3A to FIG. 3E are schematic cross-sectional views taken along line A-A' of FIG. 1D, FIG. 1E, and FIG. 1G to FIG. 1I. FIG. 4A to FIG. 4E are schematic cross-sectional views taken along line B-B' of FIG. 1D, FIG. 1E, and FIG. 1G to FIG. 1I. FIG. 5A to FIG. 5E are schematic cross-sectional views taken along line C-C' of FIG. 1D, FIG. 1E, and FIG. 1G to FIG. 1I. FIG. 6A to FIG. 6E are schematic cross-sectional views taken along line D-D' of FIG. 1D, FIG. 1E, and FIG. 1G to FIG. 1I.

Referring to FIG. 1A and FIG. 2A, the present embodiment provides a method of manufacturing a semiconductor structure including following steps. First, a substrate 100 is provided. In some embodiments, the substrate 100 may be a silicon substrate. In the present embodiment, the substrate 100 may be regarded as a target layer.

Then, a hard mask layer 102 and a strip layer 104 are sequentially formed on the substrate 100. Specifically, the hard mask layer 102 includes a first hard mask 102a and a second hard mask 102b. The second hard mask 102b is located on the first hard mask 102a and is sandwiched between the first hard mask 102a and the strip layer 104. In some embodiments, the first hard mask 102a and the second hard mask 102b may have different materials or materials with different etching selectivities. In the present embodiment, a material of the first hard mask 102a may include silicon oxide, and a material of the second hard mask 102b may include silicon or a metal-based compound. Although the hard mask layer 102 illustrated in FIG. 2A has a two-layer structure, the present invention is not limited thereto. In other embodiments, the hard mask layer 102 may have a single-layer structure or a structure with more than two layers.

As shown in FIG. 1A, the strip layer 104 includes a plurality of strips A 106, in combination with a plurality of strips B 108 and strips C 110 arranged alternately between the strips A. In some embodiments, the strips A 106, the strips B 108, and the strips C 110 are arranged in the order of B-A-C-A-B-A-C-A along a direction parallel to a top surface of the substrate 100. That is, the strips A 106, the strips B 108, and the strips C 110 extend along a Y direction and are alternately arranged in the order of B-A-C-A-B-A-C-A along a X direction.

In some embodiments, the strips A 106, the strips B 108, and the strips C 110 have different materials or different etching selectivities. For example, the strips A 106 may be an oxide (e.g., silicon oxide); the strips B 108 may be a carbide (e.g., spin-on-carbon (SoC)); and the strips C 110 may be a nitride (e.g., silicon nitride). In the present embodiment, the strip layer 104 may be formed by a double-patterning process, or a quadruple-patterning process. Specifically, the strips C 110 are formed first. Next, a material A is conformally formed on surfaces of the strips C 110, a portion of the material A is removed to form strips A 106 in a form of spacers on sidewalls of the strips C 110. Thereafter, a material B is conformally formed on surfaces of the strips A 106 and the surface of the strips C 110, and a portion of the material B is removed to form strips B 108 in the gaps between the strips A 106. In some embodiments, a width 106w of the strips A 106, a width 108w of the strips B 108, and a width 110w of the strips C 110 may have the same width or different widths. The width 106w of the strips A 106 may be in a range of 10 nm to 40 nm; the width 108w of the strips B 108 may be in a range of 10 nm to 40 nm; and the width 110w of the strips C 110 may be in a range of 10 nm to 40 nm.

In some embodiments, as shown in FIG. 2A, a thickness T1 of the strip layer 104 is greater than a thickness T2 of the second hard mask 102b. A ratio (T1/T2) of the thickness T1 of the strip layer 104 to the thickness T2 of the second hard mask 102b may be in a range of 1 to 2. In the embodiment, a material of the second hard mask 102b is different from those of the strips A 106, the strips B 108, and the strips C 110. Therefore, the second hard mask 102b may be used as an etching stop layer during removing the strips A 106, the strips B 108, and the strips C 110. The following FIG. 1B to FIG. 1C, FIG. 1F to FIG. 1G, and the related paragraphs will illustrate in detail, and will not be described in detail here.

Figure 1B:
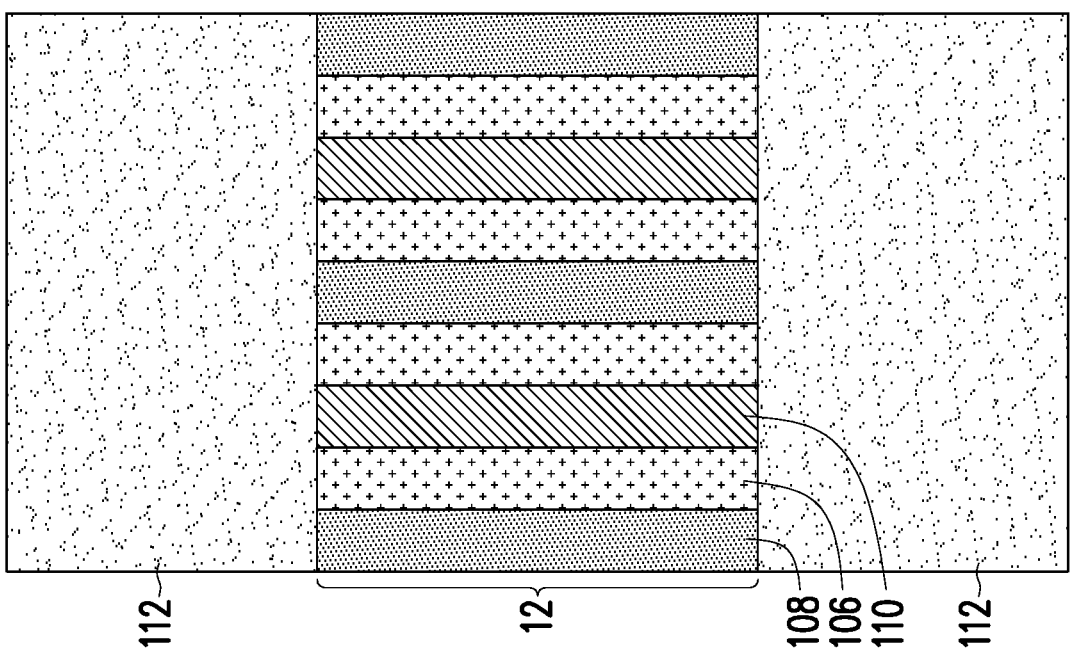
Figure 2A:
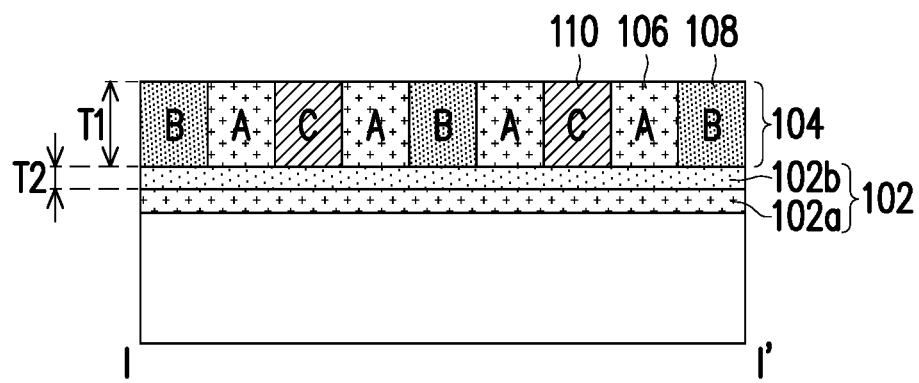
FIG. 2A to FIG. 2B are schematic cross-sectional views taken along line I-I' of FIG. 1A and FIG. 1C.
Figure 2B:
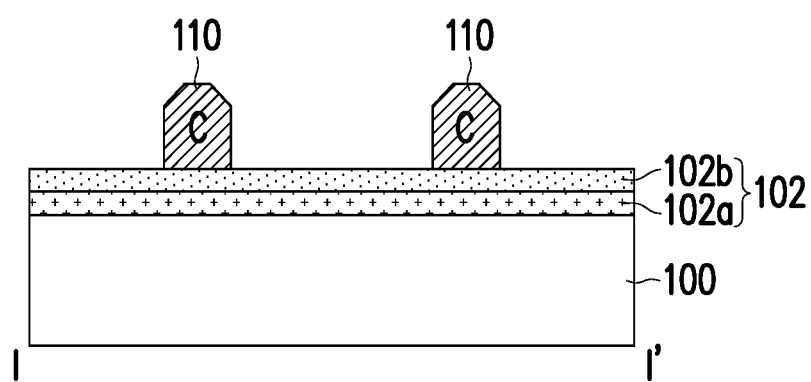

Referring to FIG. 1B, FIG. 1C, and FIG. 2B, a first mask layer 112 having a first opening 12 is formed on the strip layer 104. Portions of the strips A 106, portions of the strips B 108, and portions of the strips C 110 are exposed by the first opening 12. In some embodiments, the first mask layer 112 may be a photoresist pattern. Next, the first mask layer 112 is used as a mask to perform a first etching process, so as to remove the strips A 106 and the strips B 108 exposed by the first opening 12, thereby exposing a top surface of the second hard mask 102b. In the case, the second hard mask 102b may be regarded as an etching stop layer in the first etching process. In some embodiments, the first etching process may be a dry etching, such as reactive ion etching (RIE). The first etching process includes using an etching gas having $C_4F_8$, Ar, and $O_2$ to remove the strips A 106 (e.g., silicon oxide). The first etching process includes using an etching gas with $O_2$, to remove the strips B 108 (e.g., spin-on-carbon). However, the present invention is not limited thereto. In other embodiments, different etching gases may be used to remove the strips A 106 and the strips B 108. In some embodiments, the first etching process may include multiple etching steps, such as removing the strips A 106 and then the strips B 108; and vice versa. In addition, after the first etching process is performed, the upper portion of the strips C 110 may also be removed to cut the top corner of the strips C 110 into an inclined surface, as shown in FIG. 2B.

Figure 1E:
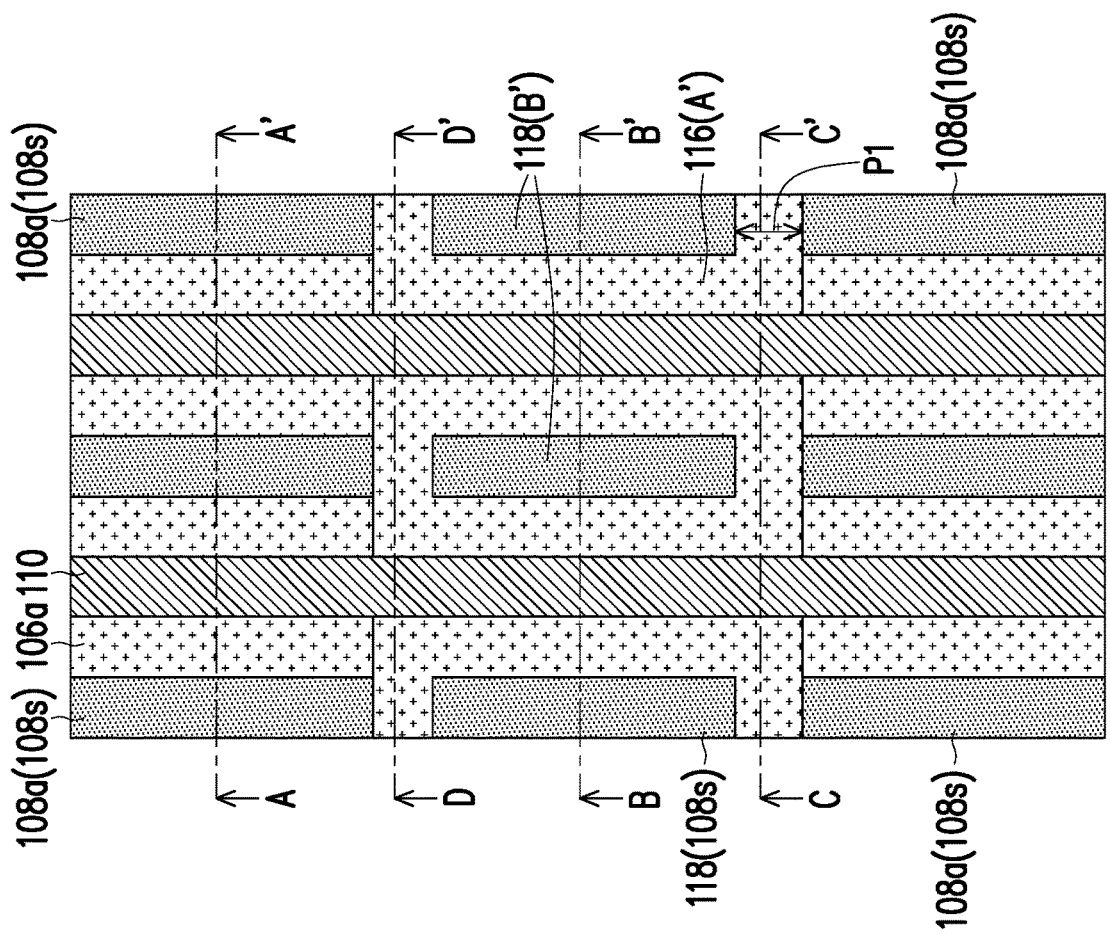
Figure 1D:
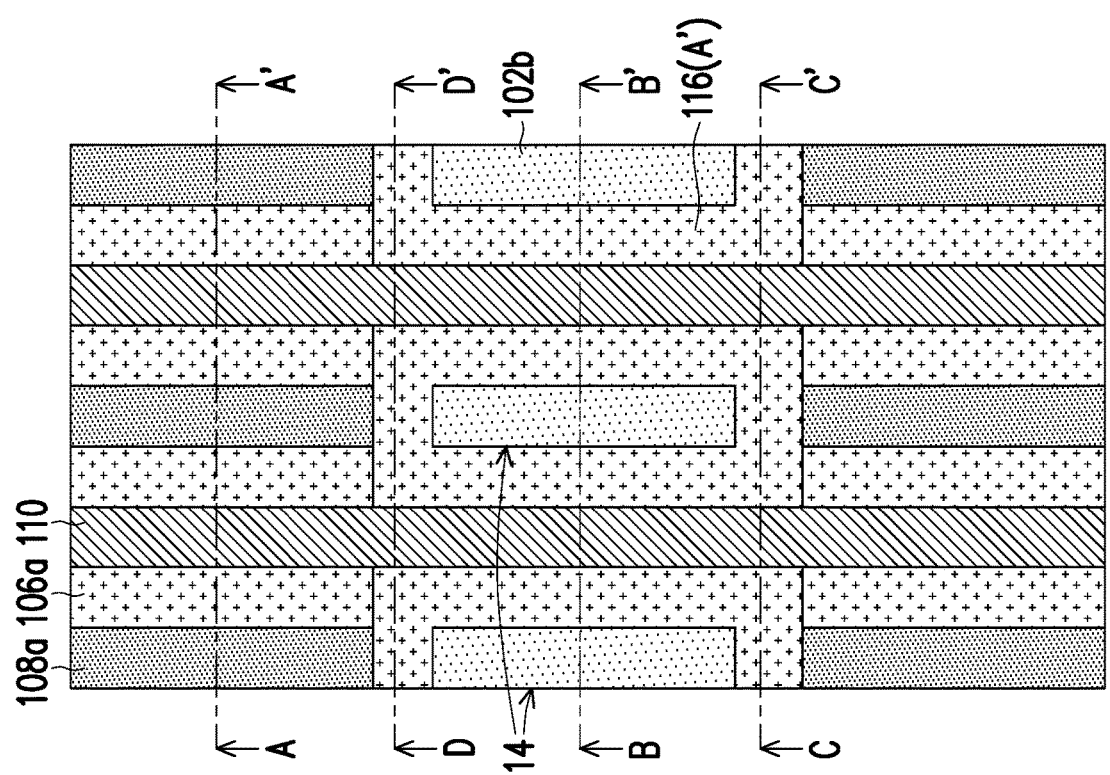
Figure 1G:
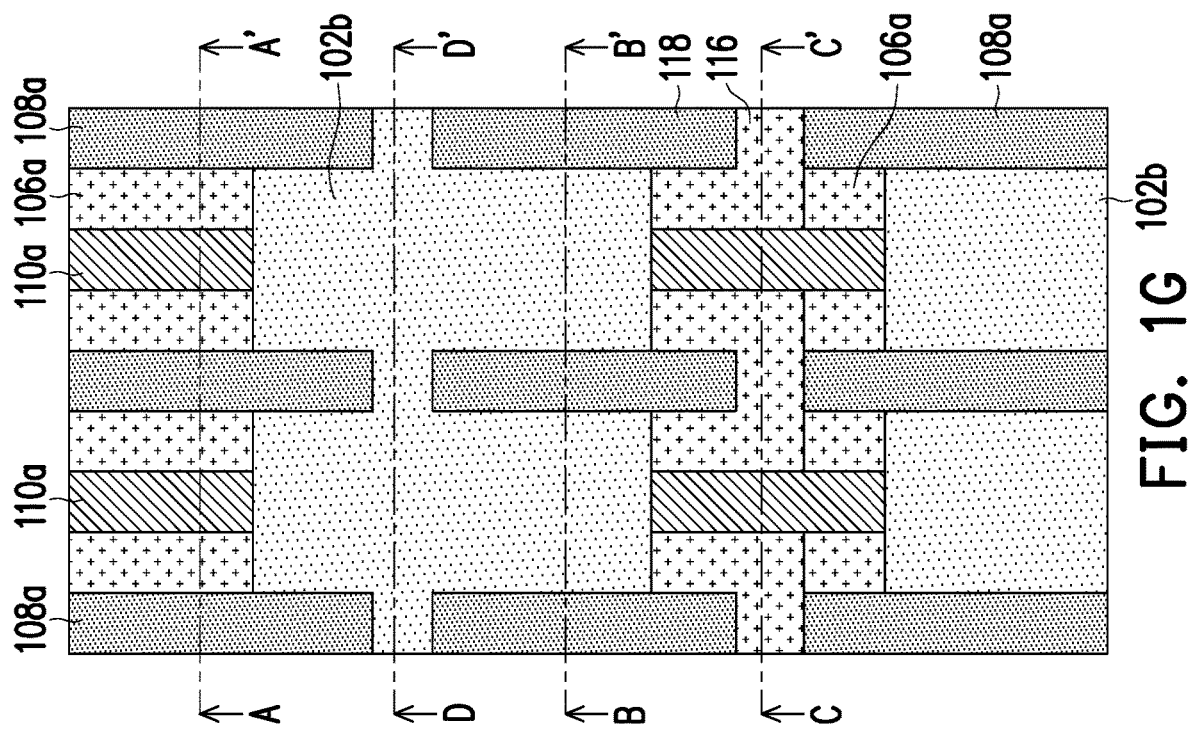
Figure 1F:
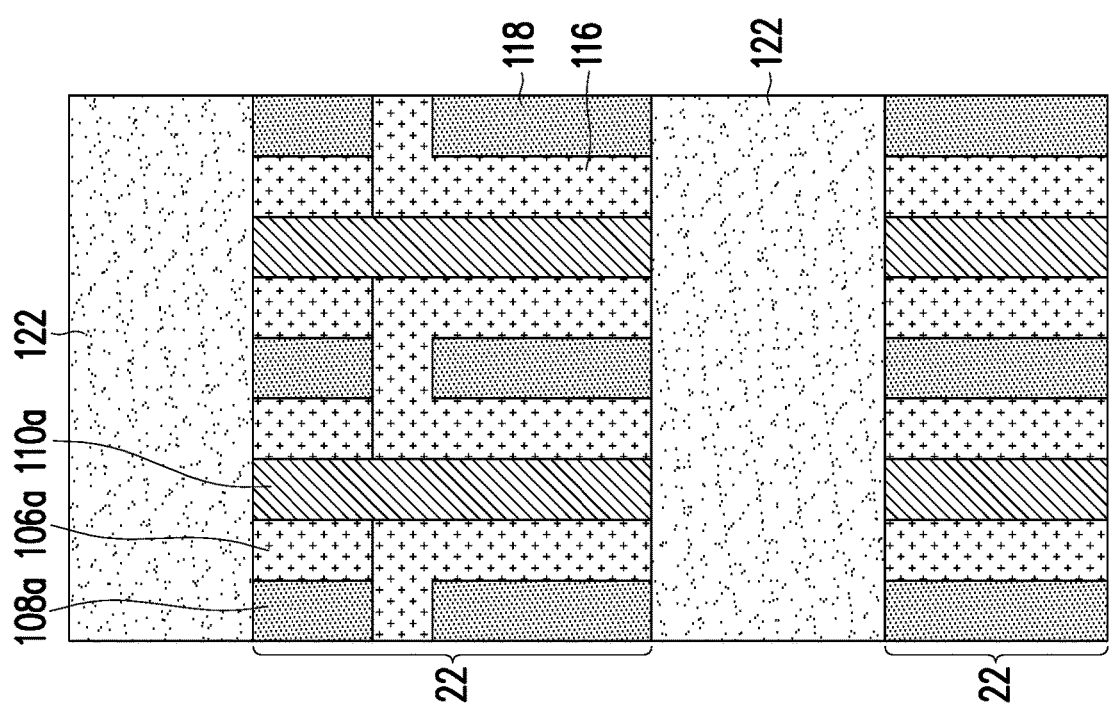

Referring to FIG. 1D, FIG. 3A, FIG. 4A, FIG. 5A, and FIG. 6A, after removing the first mask layer 112, a plurality of first spacers 116 (A') are respectively formed on sidewalls of the strips C 110 and sidewalls of the etched strips B 108a. The steps of forming the first spacers 116 have been described in detail in the above paragraphs, and will not be repeated here. After the first spacers 116 are formed, as shown in FIG. 1D, the first spacers 116 are connected to each other to form gaps 14. In some embodiments, the first spacers 116 and the strips A 106 have the same material or a material with the same etching selectivity, such as silicon oxide.

Figure 4A:
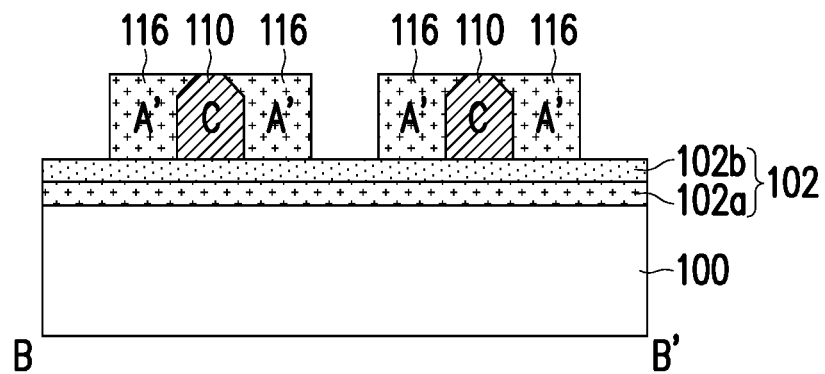
FIG. 4A to FIG. 4E are schematic cross-sectional views taken along line B-B' of FIG. 1D, FIG. 1E, and FIG. 1G to FIG. 1I.
Figure 4B:
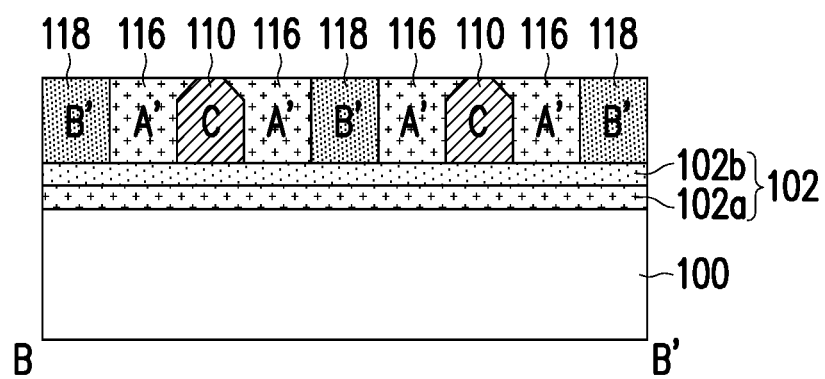
Figure 4C:
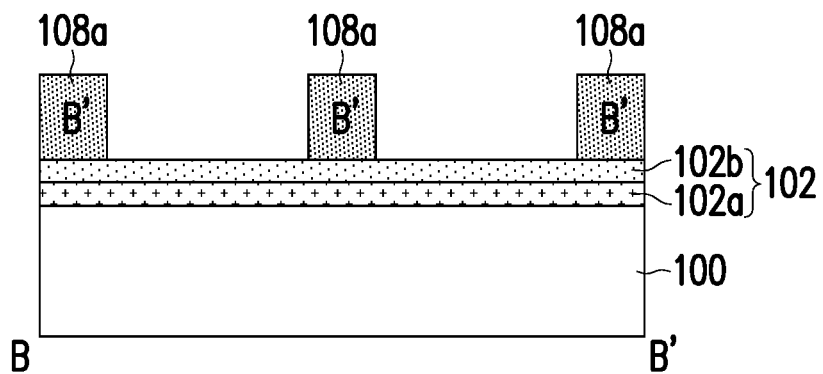
Figure 4D:
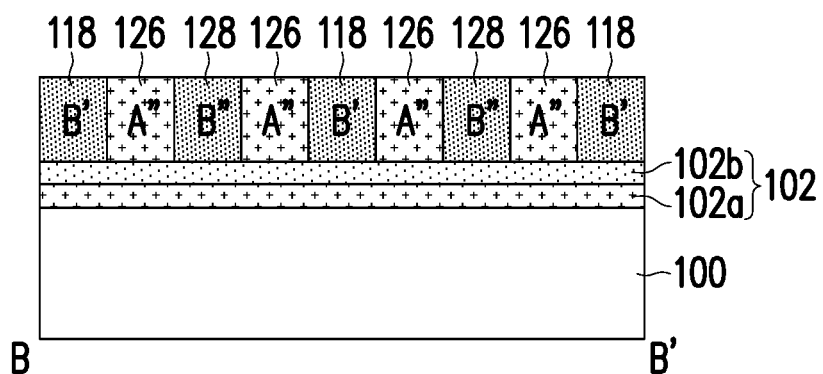
Figure 4E:
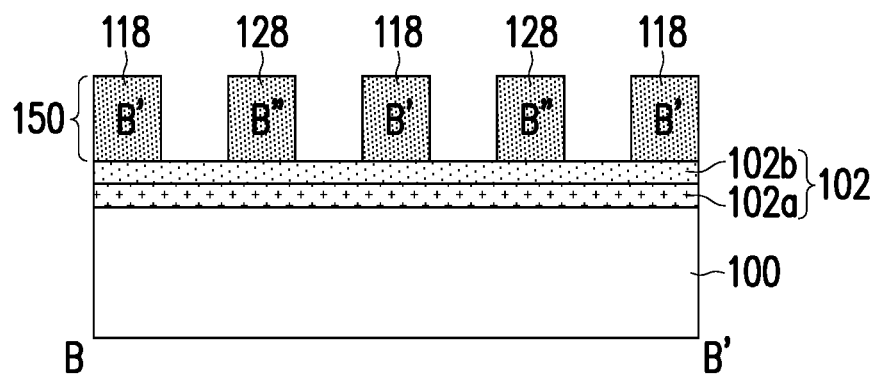
Figure 5A:
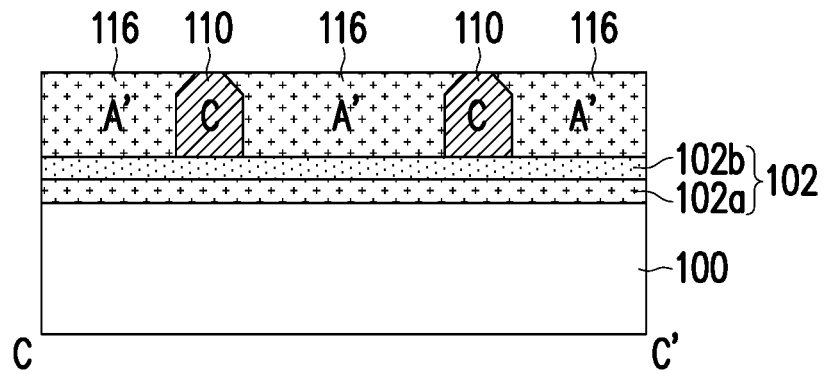
FIG. 5A to FIG. 5E are schematic cross-sectional views taken along line C-C' of FIG. 1D, FIG. 1E, and FIG. 1G to FIG. 1I.
Figure 5B:
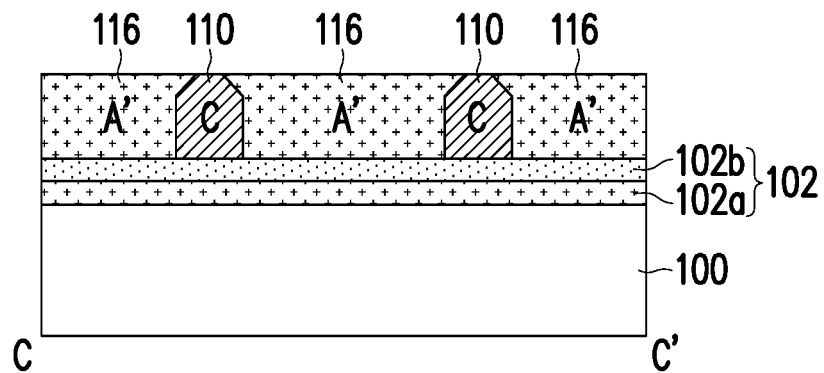
Figure 5C:
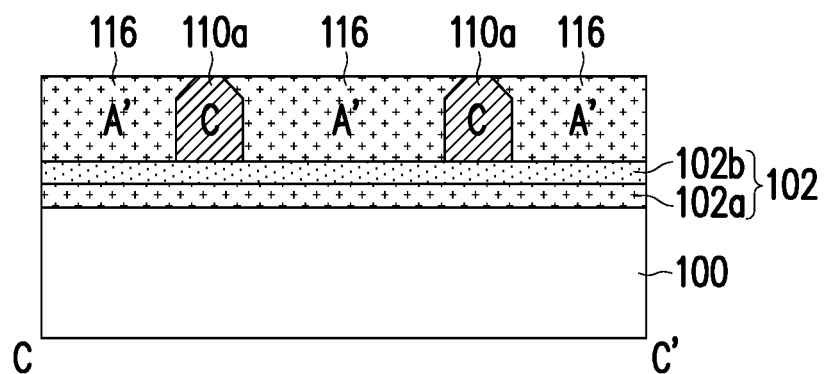
Figure 5D:
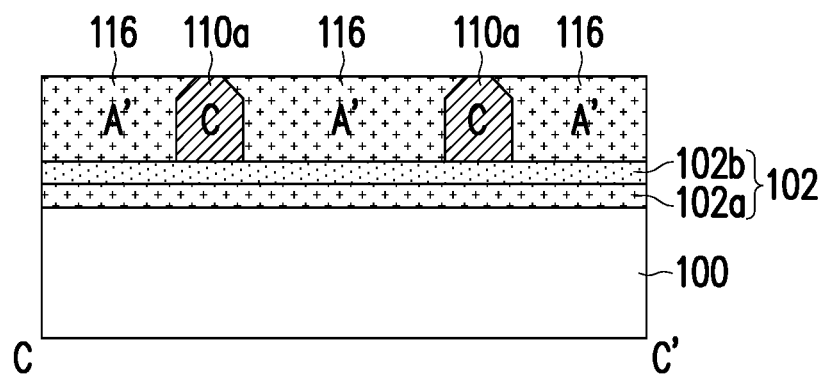
Figure 5E:
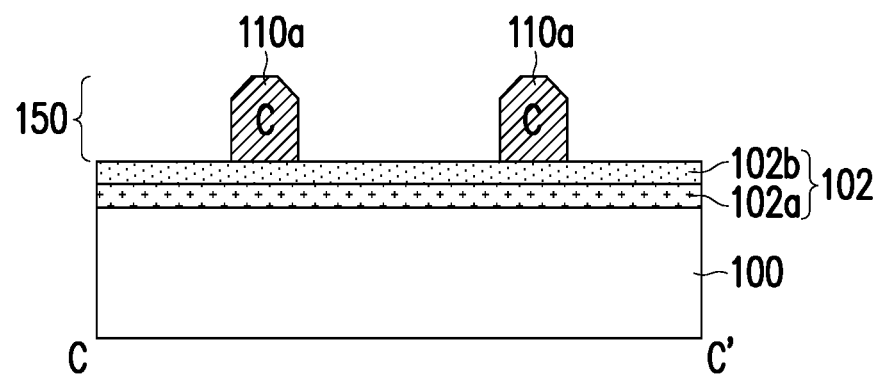
Figure 6A:
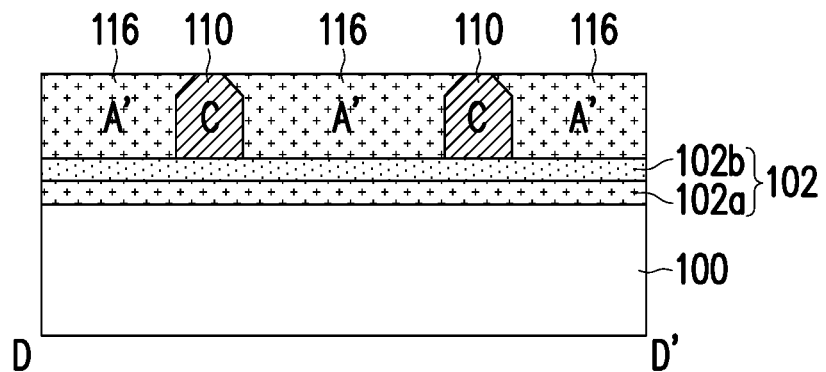
FIG. 6A to FIG. 6E are schematic cross-sectional views taken along line D-D' of FIG. 1D, FIG. 1E, and FIG. 1G to FIG. 1I.
Figure 6B:
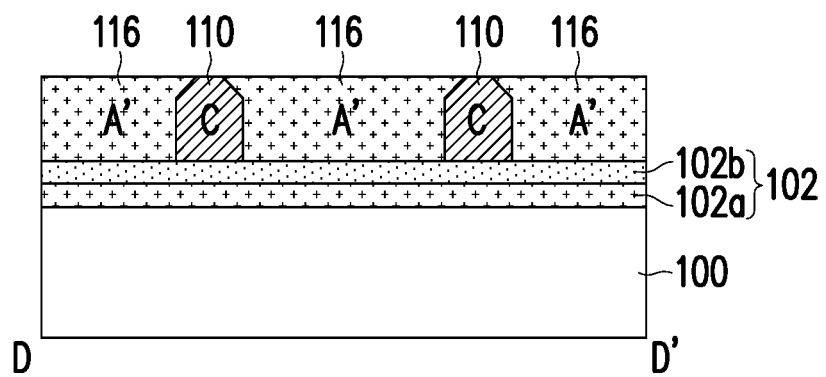
Figure 6C:
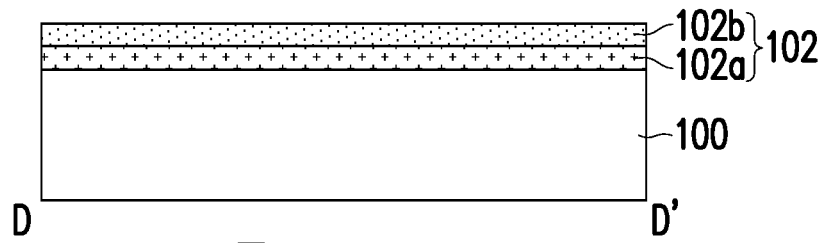
Figure 6D:
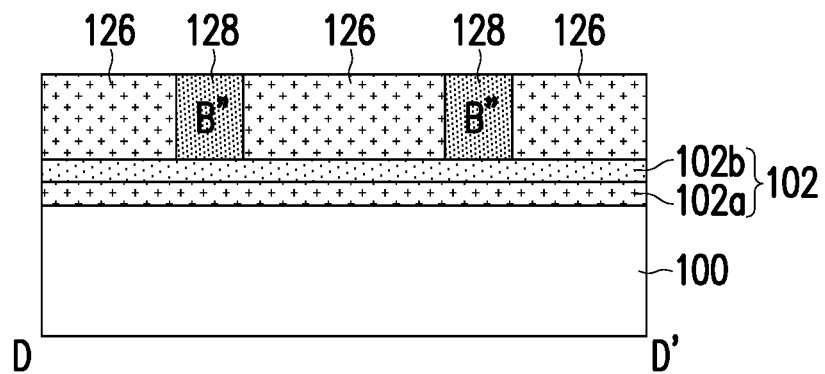
Figure 6E:
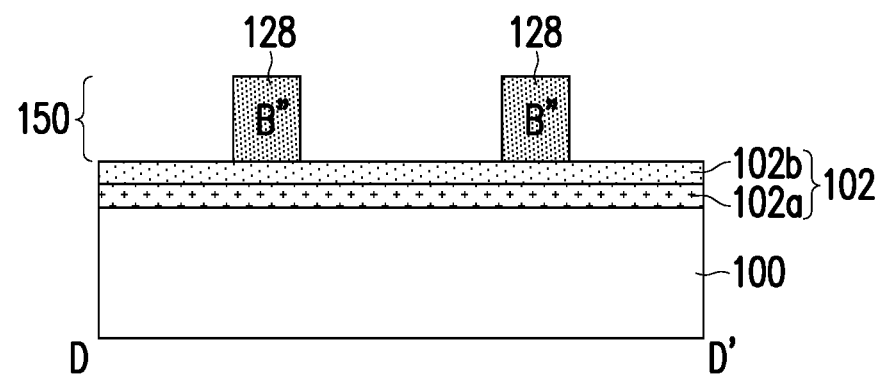

Referring to FIG. 1E, FIG. 3B, FIG. 4B, FIG. 5B, and FIG. 6B, a plurality of second spacers 118 (B') are formed on sidewalls of the first spacers 116. From another perspective, a spacer material is formed to fill into the gaps 14 to form the second spacers 118. In some embodiments, the second spacers 118 and the strips B 108a have the same material or a material with the same etching selectivity, such as spin-on-carbon. In some embodiments, as shown in FIG. 4B, the top surfaces of the strips C 110 may be considered to be coplanar with the top surfaces of the first spacers 116 and the top surfaces of the second spacers 118.

It should be noted that the second spacer 118 located between two strips B 108a may be regarded as a portion of the strips B 108a. That is, as shown in FIG. 1A and FIG. 1E, after forming the second spacers 118, the continuous strip 108 illustrated in FIG. 1A is divided into a plurality of strip segments B 108s by the first spacers 116. In some embodiments, the strip segments B 108s have gaps P1 in a range of 10 nm to 20 nm. Herein, as shown in FIG. 1E, the pitch P1 of the strip segments B 108s is referred to as a shortest distance of facing sides of adjacent strip B 108a and second spacer 118. Although the second spacers 118 and the strips B 108a illustrated in FIG. 1E have the same width, the present invention is not limited thereto. In other embodiments, the second spacers 118 and the strips B 108a may have different widths.

Referring to FIG. 1F, FIG. 1G, FIG. 3C, FIG. 4C, FIG. 5C, and FIG. 6C, a second mask layer 122 having a second opening 22 is formed on the strip layer 104. Portions of the strips A 106a, portions of the strips B 108a, portions of the strips C 110, portions of the first spacers 116, and portions of the second spacers 116 are exposed by the second opening 22. In some embodiments, the second mask layer 122 may be a photoresist pattern. Next, the second mask layer 122 is used as a mask for a second etching process to remove the strips A 106a, the first spacers 116, and the strips C 110 exposed by the second opening 22, thereby exposing the top surface of the second hard mask 102b. In the case, the second hard mask 102b may be regarded as an etching stop layer in the second etching process. In some embodiments, the second etching process may be a dry etching, such as RIE. The second etching process includes using an etching gas having $C_4F_8$, Ar, and $O_2$ to remove the strips A 106a and the first spacers 116 (e.g., silicon oxide). The second etching process includes using an etching gas having $CF_4$, $O_2$, and $N_2$ to remove the strips C 110 (e.g., silicon nitride). However, the present invention is not limited thereto. In other embodiments, different etching gases may be used to remove the strips A 106a, the first spacers 116, and the strips C 110. In some embodiments, the second etching process may include multiple etching steps, such as removing the strips A 106a and the first spacers 116, and then removing the C strip 110; and vice versa.

Figure 1I:
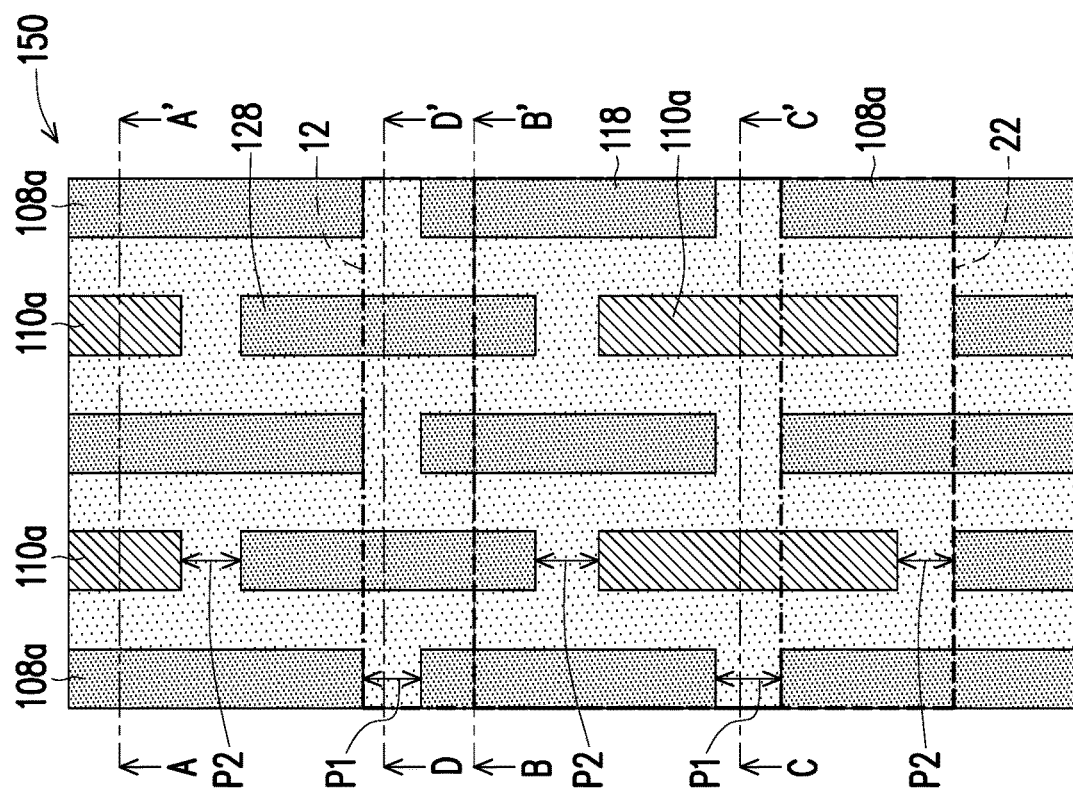
Figure 1H:
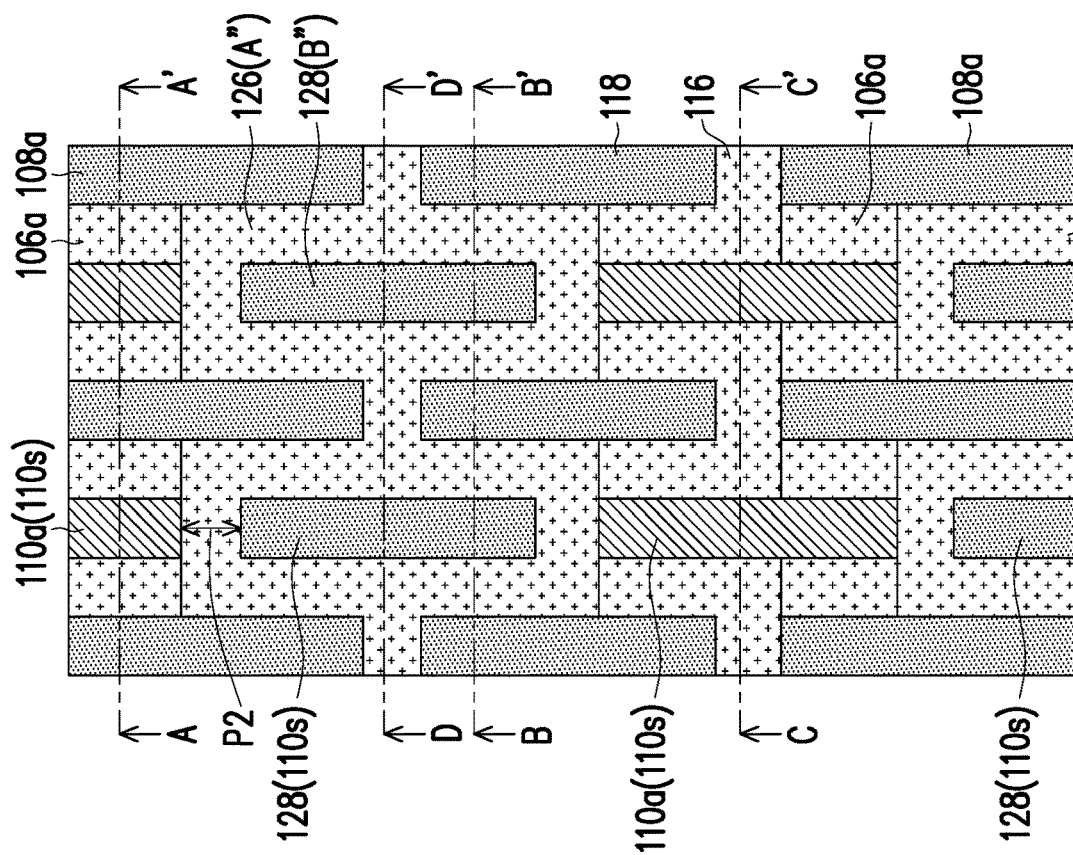

Referring to FIG. 1H, FIG. 3D, FIG. 4D, FIG. 5D, and FIG. 6D, after removing the second mask layer 122, a plurality of third spacers 126 (A") are formed respectively on the sidewalls of the strips B 108a and the sidewalls of the spacers 118. The forming steps of the third spacer 126 have been described in detail in the above paragraphs, and will not be repeated here. In some embodiments, the third spacer 126 and the strips A 106 have the same material or a material with the same etching selectivity, such as silicon oxide. After forming the third spacer 126, as shown in FIG. 1H, a plurality of fourth spacers 128 (B") are formed respectively on the sidewalls of the third spacer 126. In some embodiments, the fourth spacers 128 and the strips B 108 have the same material or a material with the same etching selectivity, such as spin-on-carbon. However, the present invention is not limited thereto. In other embodiments, the fourth spacers 128 and the strips C 110 may have the same material.

It should be noted that the fourth spacer 128 located between two strips C 110a may be regarded as a portion of the strips C 110a. That is, as shown in FIG. 1A and FIG. 1H, after forming the fourth spacers 128, the continuous strip C 110 illustrated in FIG. 1A is divided into a plurality of strip segments C 110s by the third spacers 126. In some embodiments, the strip segments C 110s have a pitch P2 in a range of 40 nm to 80 nm. Herein, as shown in FIG. 1H, the pitch P2 of the strip segments C 110s is referred to as a shortest distance of facing sides of adjacent strip C 110a and fourth spacer 128. Although the fourth spacers 128 and the strips C 110a illustrated in FIG. 1H have the same width, the present invention is not limited thereto. In other embodiments, the fourth spacers 128 and the strips C 110a may have different widths.

Referring to FIG. 1I, FIG. 3E, FIG. 4E, FIG. 5E, and FIG. 6E, a third etching process is performed to remove the strips A 106a, the first spacers 116, and the third spacer 126, so as to form a pattern layer 150. As shown in FIGS. 3E, 4E, 5E, and 6E, the pattern layer 150 exposes the top surface of the second hard mask 102b. In the case, the second hard mask 102b may be regarded as an etching stop layer in the third etching process. In some embodiments, the third etching process may be a dry etching, a wet etching, or a combination thereof. For example, the third etching process includes using an etching gas having $C_4F_8$, Ar, and $O_2$ to completely remove the strips A 106a, the first spacers 116, and the third spacer 126 (e.g., silicon oxide). However, the present invention is not limited thereto. In other embodiments, the third etching process also includes using a dilute hydrofluoric acid (DHF) solution.

It should be noted that, as shown in FIG. 1I, the first opening 12 is partially overlapped with the second opening 22, so that the strip segments B 108s and the strip segments C 110s are disposed in a staggered manner. In other words, the pitch P1 of the strip segments B 108s and the pitch P2 of the strip segments C 110s are offset from each other. However, the present invention is not limited thereto. In other embodiments, the first opening 12 may be completely overlapped with the second opening 22, so that the strip segments B 108s and the strip segments C 110s are arranged correspondingly.

Figure 3A:
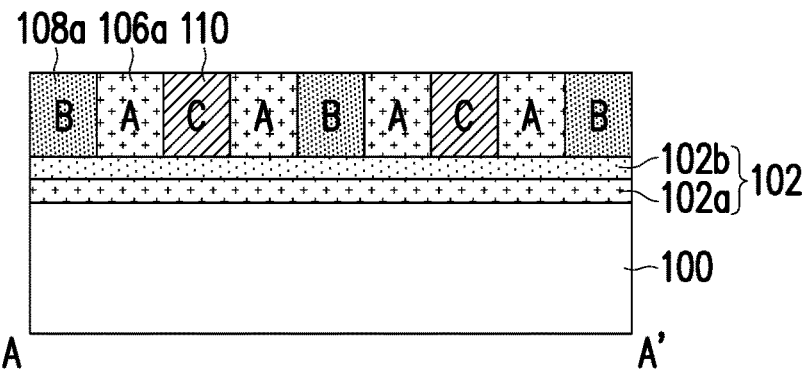
FIG. 3A to FIG. 3E are schematic cross-sectional views taken along line A-A' of FIG. 1D, FIG. 1E, and FIG. 1G to FIG. 1I.
Figure 3B:
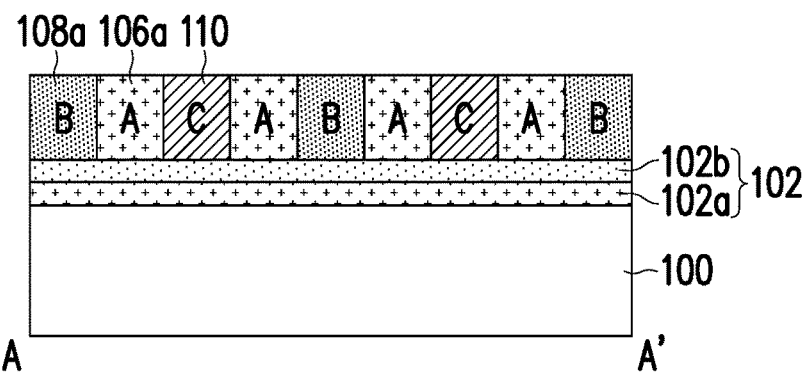
Figure 3C:
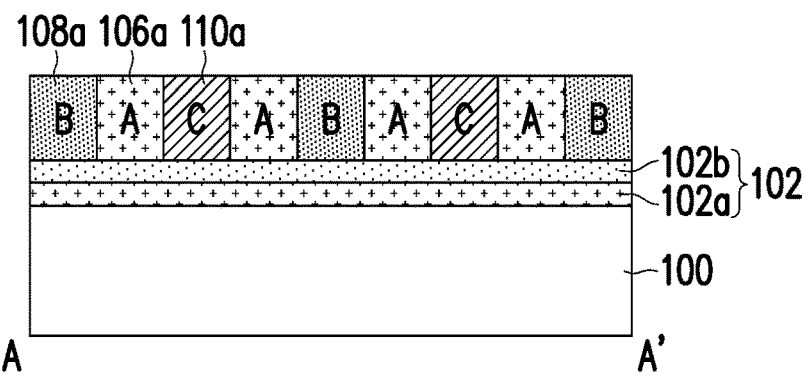
Figure 3D:
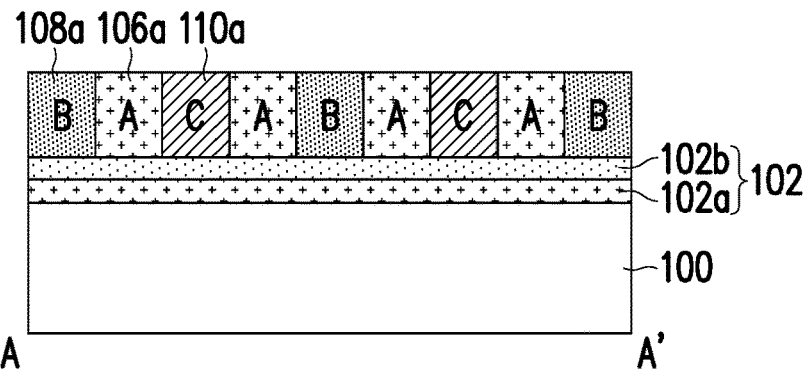
Figure 3E:
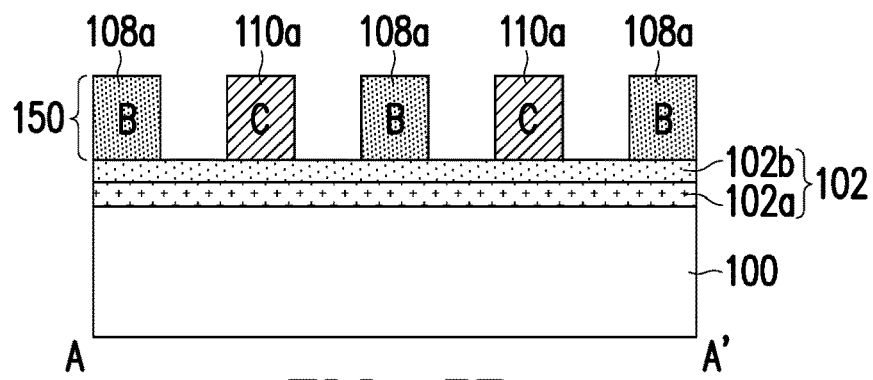
Figure 3F:
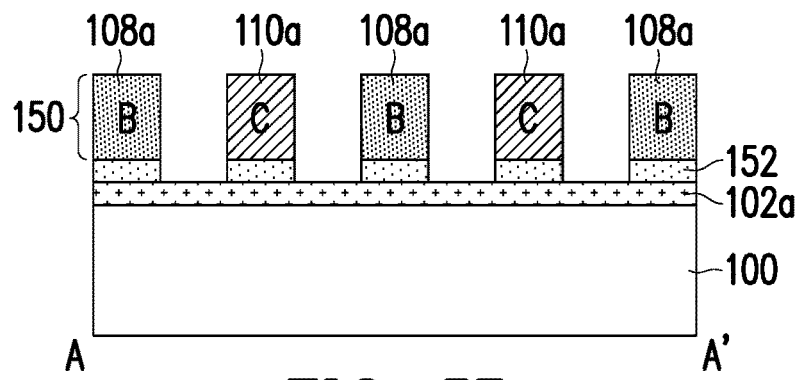
FIG. 3F to FIG. 3H are schematic cross-sectional views of a manufacturing process of another semiconductor structure taken along line A-A' of FIG. 1I.
Figure 3G:
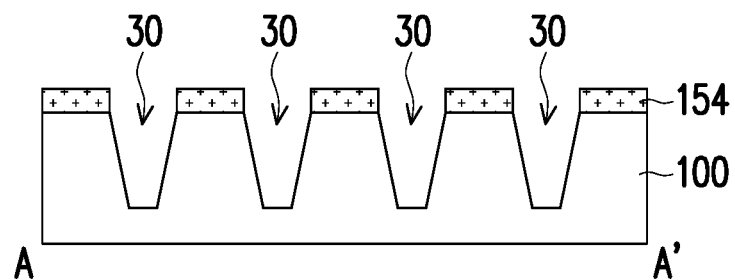
Figure 3H:
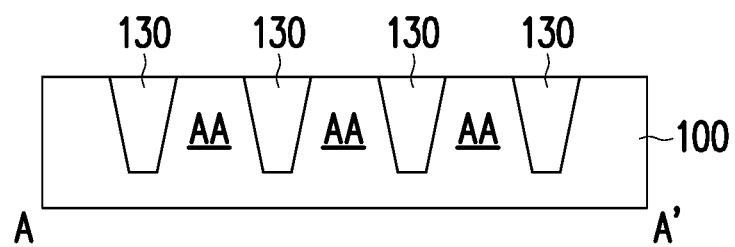

FIG. 3F to FIG. 3H are schematic cross-sectional views of a manufacturing process of another semiconductor structure taken along line A-A' of FIG. 1I.

A structure illustrated in FIG. 3F continues a structure illustrated in FIG. 3E to perform the subsequent processes. Specifically, a portion of the second hard mask 102b is removed by using the pattern layer 150 as a mask to form a first mask pattern 152, as shown in FIG. 3F. In some embodiments, when the material of the second hard mask 102b is silicon or contains metal, an etching gas including chlorine may be used to remove the second hard mask 102b.

Referring to FIG. 3F and FIG. 3G, a portion of the first hard mask 102a is removed by using the first mask pattern 152 as a mask to form a second mask pattern 154. In some embodiments, as shown in FIG. 3G, the remaining pattern layer 150 and the first mask pattern 152 are removed to expose the second mask pattern 154. In some embodiments, when the material of the first hard mask 102a is silicon oxide, the first hard mask 102a may be removed by using an etching gas including an etching gas of $C_4F_8$, Ar, and $O_2$. Then, a portion of the substrate 100 is removed by using the second mask pattern 154 as a mask to form a plurality of third openings 30 in the substrate 100.

Referring to FIG. 3H, an isolation material is filled in the third opening 30 to form a plurality of isolation structures 130 in the substrate 100. In some embodiments, the isolation material includes silicon oxide, silicon nitride, or a combination thereof. The isolation structure 130 may be a shallow trench isolation (STI) structure, a deep trench isolation (DTI) structure, or a combination thereof. It should be noted that the unetched substrate 100 may be referred to as active areas AA located between the isolation structure 130. The active areas AA may replicate the pattern of the pattern layer 150 illustrated in FIG. 1I to be disposed and staggered with each other.

FIG. 7A to FIG. 7F are schematic top views of a manufacturing process of a semiconductor structure according to a second embodiment of the invention.

Figure 7A:
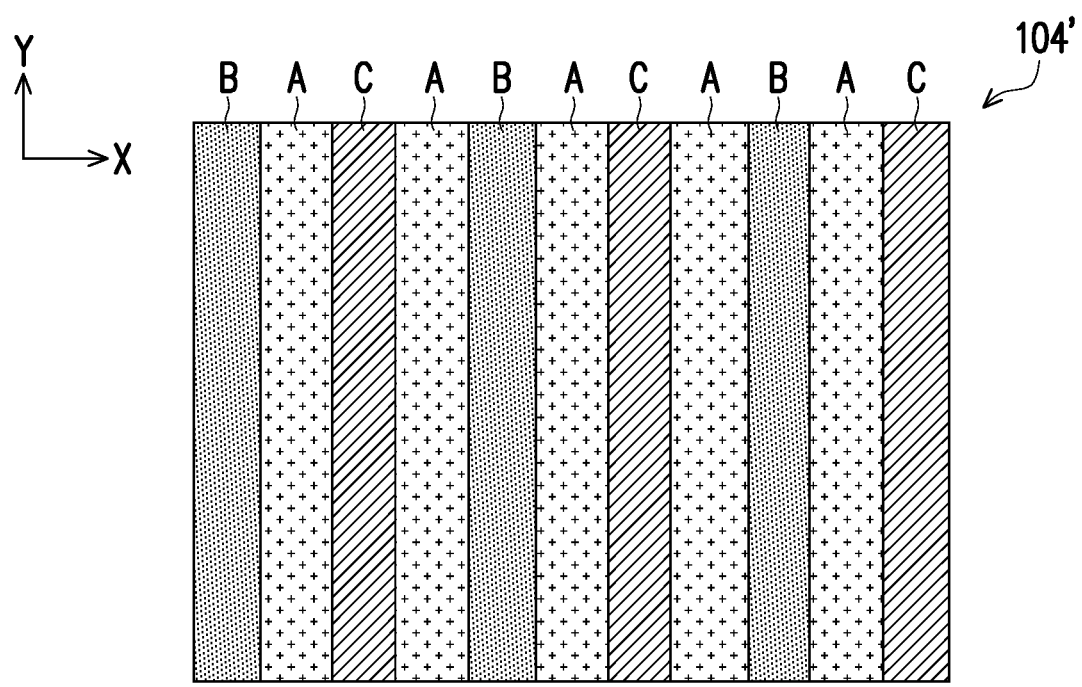
FIG. 7A to FIG. 7F are schematic top views of a manufacturing process of a semiconductor structure according to a second embodiment of the invention.

Referring to FIG. 7A, first, a strip layer 104' is provided. The strip layer 104' of FIG. 7A is similar to the strip layer 104 of FIG. 1A, and includes a plurality of materials A, a plurality of materials B, and a plurality of materials C extending along the Y direction and alternately arranged in the order of B-A-C-A-B-A-C-A along the X direction. In the present embodiment, the materials and manufacturing methods of the materials A, B, and C are similar to the materials and manufacturing methods of strips A 106, the strips B 108, and the strips C 110, and are not repeated here.

Figure 7B:
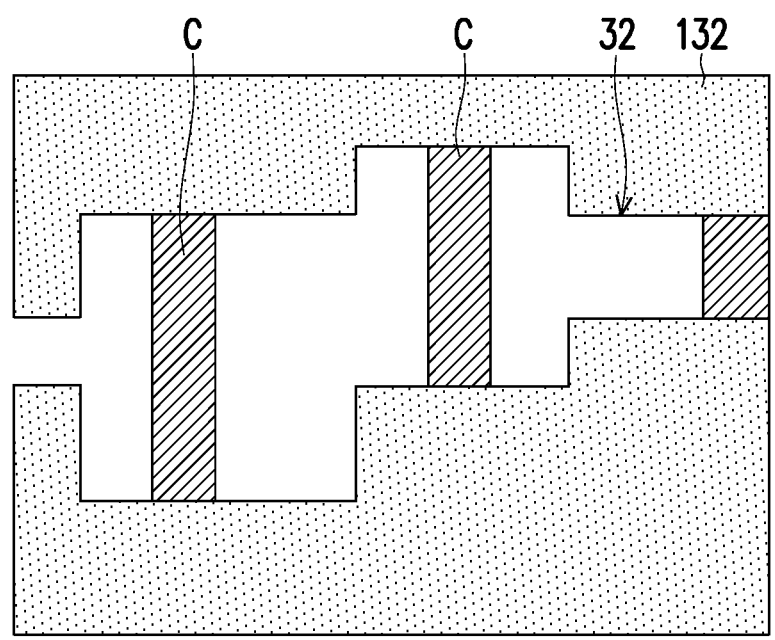

Referring to FIGS. 7A and 7B, a first mask layer 132 having a first opening 32 is formed on the strip layer 104'. Then, the materials A and B exposed by the first opening 32 are removed by using the first mask layer 132 as a mask. Unlike the first embodiment, the first opening 32 of the second embodiment has an irregular shape. In some embodiments, the shape of the first opening 32 may be adjusted according to the positions where the materials B are intended to be cut off.

Figure 7C:
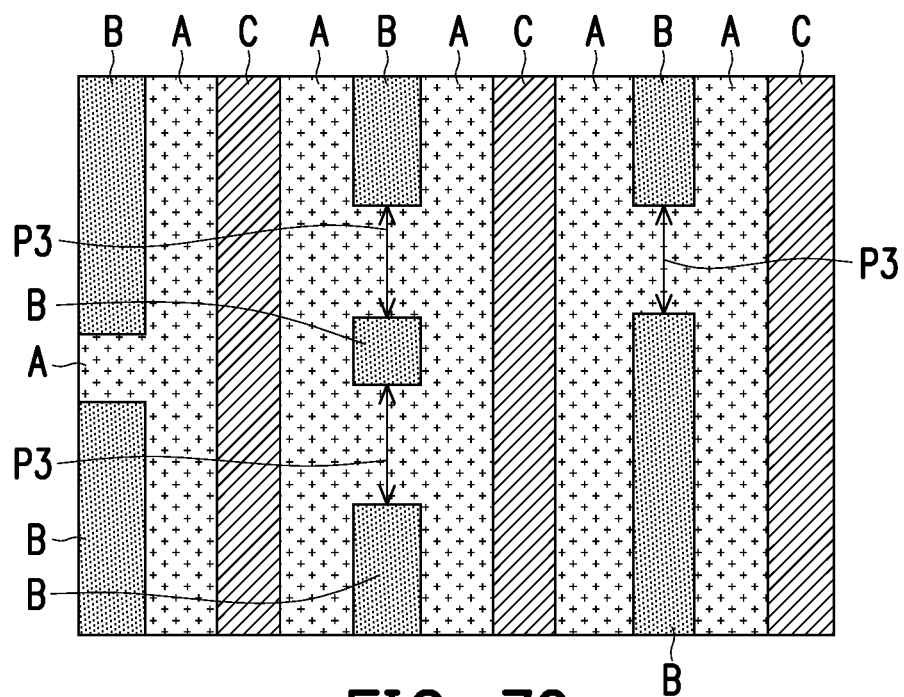

Referring to FIG. 7C, after removing the first mask layer 132, a plurality of first spacers (A) are formed respectively on the sidewalls of the materials C and the sidewalls of the etched materials B. In the embodiment, since the first spacers and the materials A have the same material, the first spacers and the materials A illustrated in FIG. 7C may be referred to as a continuous structure and be labeled as "A". After forming the first spacers A, a plurality of second spacers (B) are formed respectively on the sidewalls of the first spacers A. In the embodiment, since the material of the second spacers is the same as that of the materials B, the second spaces and the materials B illustrated in FIG. 7C may be referred to as the same component and be labeled as "B". It should be noted that, after the steps of FIG. 7A to FIG. 7C, the continuous material B of FIG. 7A is divided into a plurality of segments B by the first spacers A. In some embodiments, the gaps P3 between the segments B in any two columns may have different quantity and may be interleaved with each other, as shown in FIG. 7C. Any two gaps P3 may be equal to or different from each other. In alternative embodiments, the gaps of the segments B in any two columns may be all equal, as shown in FIG. 1I.

Figure 7D:
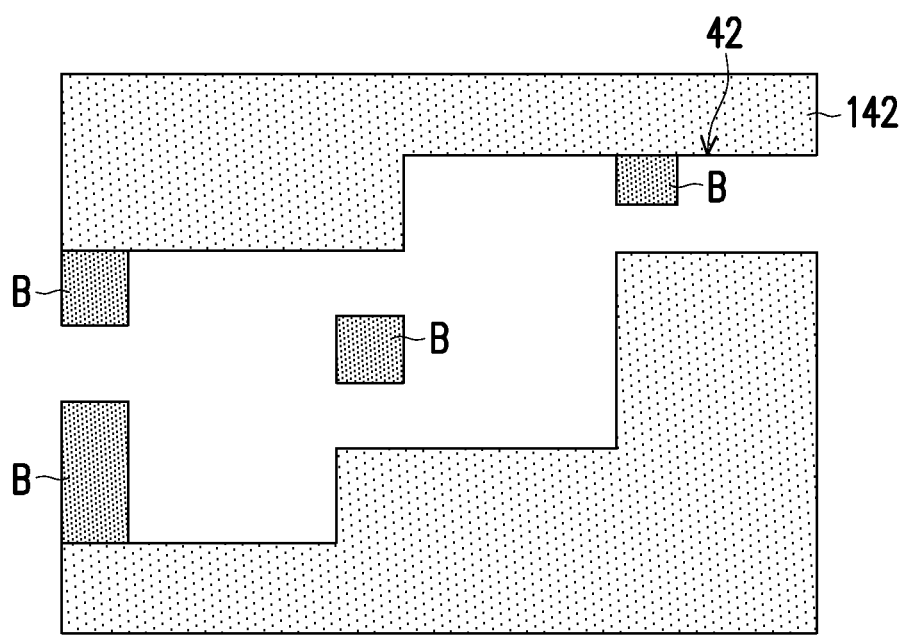

Referring to FIG. 7C and FIG. 7D, a second mask layer 142 having a second opening 42 is formed on the strip layer 104'. Next, the materials A and C exposed by the second opening 42 are removed by using the second mask layer 142 as a mask. Unlike the first embodiment, the second opening 42 of the second embodiment has an irregular shape. In some embodiments, the shape of the second opening 42 may be adjusted according to the position where the materials C are intended to be cut off, and the present invention is not limited thereto.

Figure 7E:
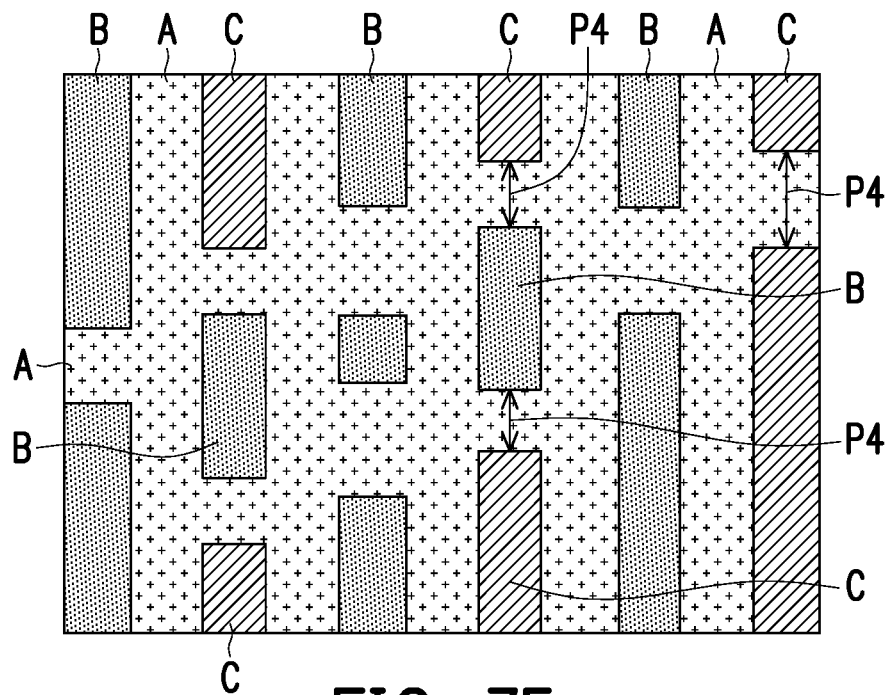

Referring to FIG. 7E, after removing the second mask layer 142, a plurality of third spacers (A) are formed respectively on the sidewalls of the materials B and the sidewalls of the etched materials C. In this embodiment, since the third spacers and the materials A have the same material, the third spacers and the materials A illustrated in FIG. 7E may be referred to as a continuous structure and be labeled as "A". After forming the third spacers A, a plurality of fourth spacers (B) are formed respectively on the sidewalls of the third spacers A. In the embodiment, since the material of the fourth spacers is the same as the material of the materials B, the fourths spacers and the material B illustrated in FIG. 7E may be referred to as the same component and be labeled as "B". It should be noted that, after the steps of FIG. 7D to FIG. 7E, the continuous material C of FIG. 7A is divided into a plurality of segments C by the third spacers A. In some embodiments, the gaps P4 of the segments C in any two columns may have different quantity and may be interleaved with each other, as shown in FIG. 7E. Any two gaps P4 may be equal to or different from each other. In alternative embodiments, the gaps of the segments C in any two columns may all be equal, as shown in FIG. 1I.

Figure 7F:
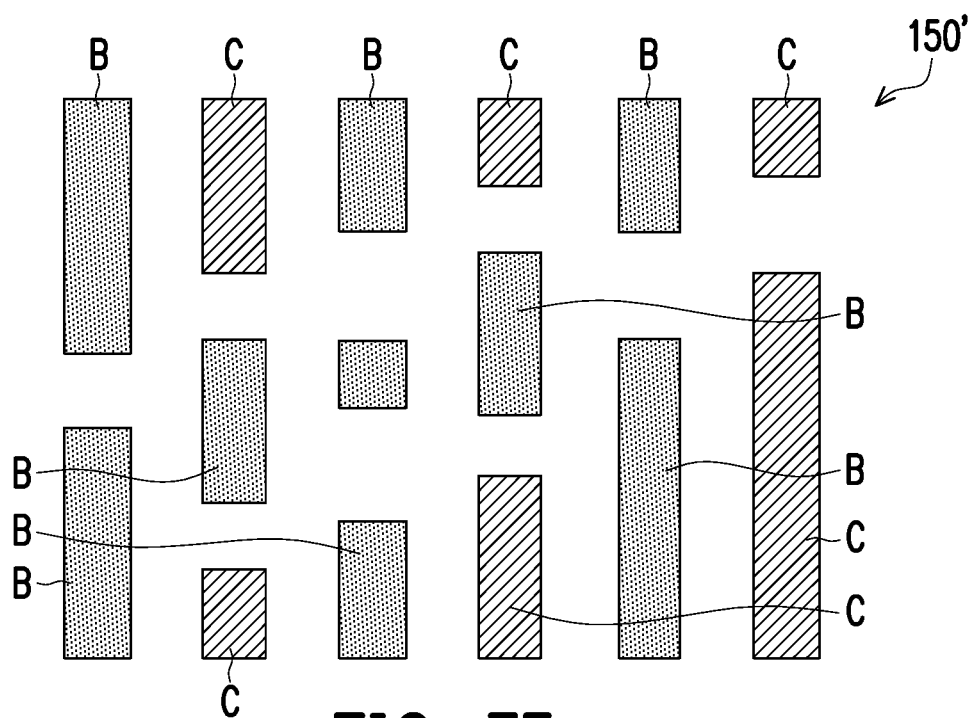

Referring to FIG. 7E and FIG. 7F, the materials A are removed to form a pattern layer 150'. It should be noted that, in the present embodiment, three kinds of materials and two photomasks may be used to arbitrarily cut the materials A and B, thereby forming the pattern layer 150'. The pattern layer 150' may be used to pattern the underlying target layer to form various semiconductor structures, such as active areas (AA), landing pads, contact structures, interconnect structures, or a combination thereof. In the case, the patterning method of the present embodiment can simplify the manufacturing process and reduce the manufacturing cost while improving the integration density of the semiconductor structure. Furthermore, the cut is self-aligned, and hence will not damage pre-existing features due to overlay errors.

FIG. 8A to FIG. 8J are schematic top views of a manufacturing process of a semiconductor structure according to a third embodiment of the invention.

Figure 8A:
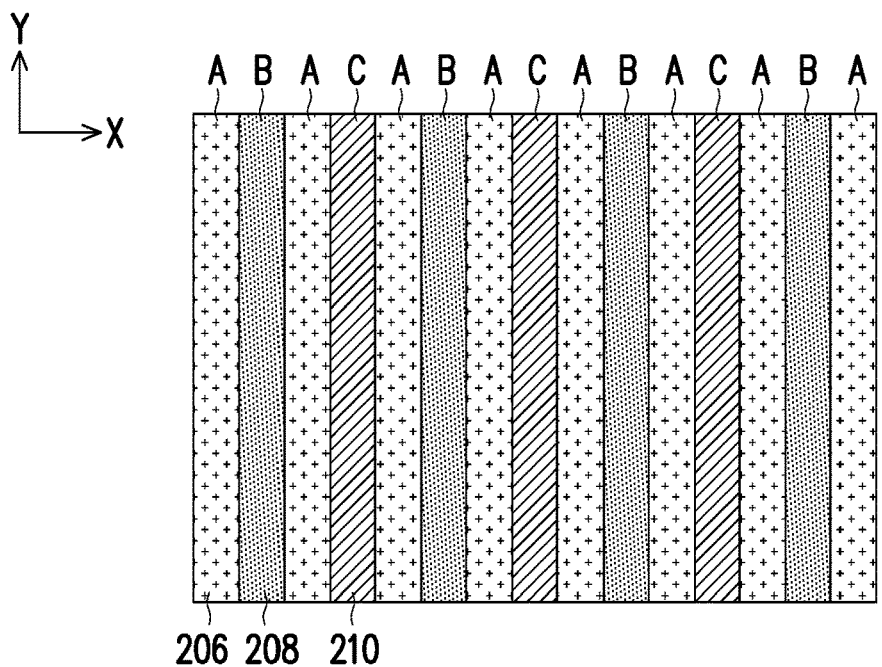
FIG. 8A to FIG. 8J are schematic top views of a manufacturing process of a semiconductor structure according to a third embodiment of the invention.

Referring to FIG. 8A, first, a stripe layer 204 is provided. The stripe layer 204 of FIG. 8A is similar to the strip layer 104 of FIG. 1A, and includes a plurality of strips A 206, a plurality of strips B 208, and a plurality of strips C 210 extending along the Y direction and alternately arranged in the order of A-B-A-C-A-B-A-C along the X direction. In the present embodiment, the materials and manufacturing methods of the strips A 206, the strips B 208, and the strips C 210 are similar to the materials and manufacturing methods of the strips A 106, the strips B 108, and the strips C 110, and will not be repeated here.

Figure 8B:
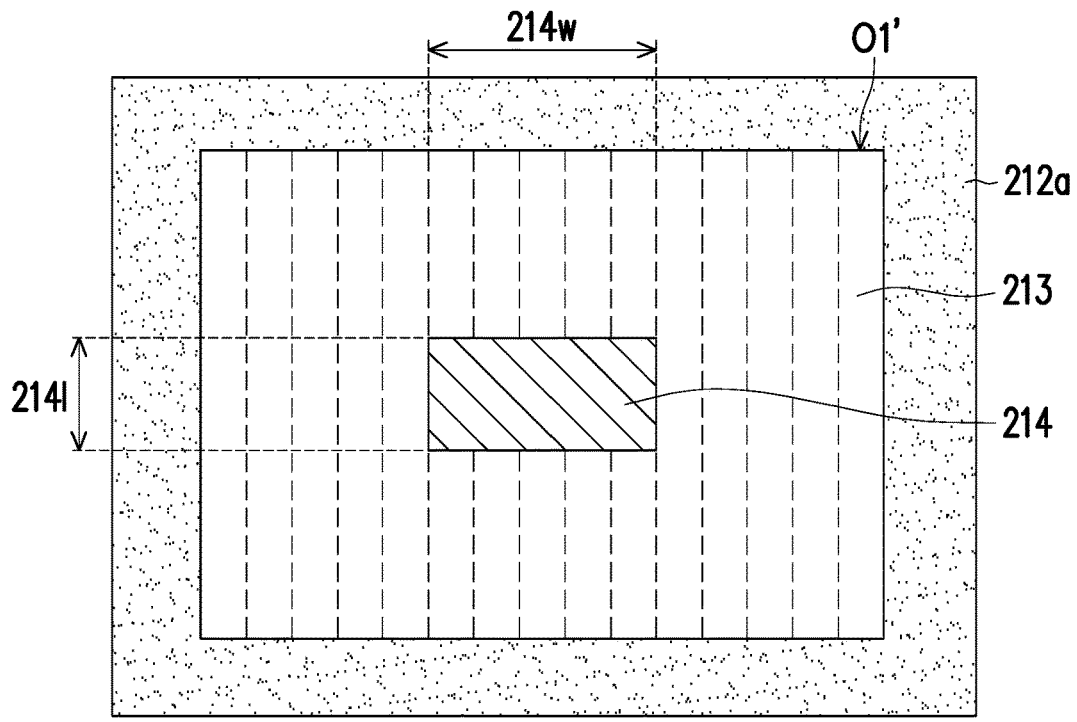
Figure 8C:
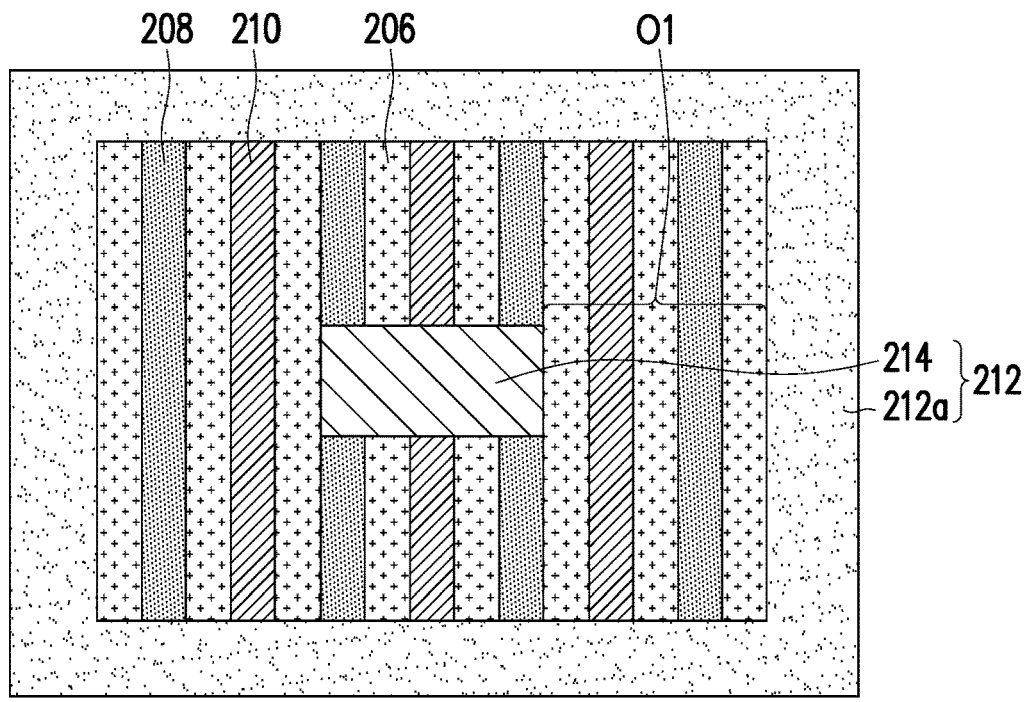

Referring to FIG. 8B and FIG. 8C, a first mask layer 212 having a first opening O1 is formed on the stripe layer 204. As shown in FIG. 8C, the first opening O1 is donut-shaped. In some embodiments, forming the first opening O1 having the donut shape includes the following steps. First, as shown in FIG. 8B, a first initial mask layer 212a having a first initial opening O1' is formed. Then, a first sacrificial spacer 213 is formed on a sidewall of the first initial opening O1'. Thereafter, a second sacrificial spacer 214 is formed on the sidewall of the first sacrificial spacer 213. Next, the first sacrificial spacer 213 is removed to expose the underlying stripe layer 204. In the case, the second sacrificial spacer 214 and the first initial mask layer 212a constitute the first mask layer 212 with the donut opening O1. In some embodiments, the second sacrificial spacer 214 and the first initial mask layer 212a may have the same material or different materials. In the present embodiment, a material of the initial mask layer 212a is photoresist, a material of the first sacrificial spacer 213 may be a metal-containing material; and a material of the second sacrificial spacer 214 may be amorphous carbon or spin-on carbon. In alternative embodiments, the first sacrificial spacer 213 and the second sacrificial spacer 214 may have different materials or materials that may have different etching selectivities. In some embodiments, as shown in FIG. 8C, the second sacrificial spacer 214 at least covers the position where the strips B 208 are intended to be cut off, but the invention is not limited thereto. In some embodiments, a length 2141 of the second sacrificial spacer 214 is 15 nm to 30 nm, and a width 214w of the second sacrificial spacer 214 is 25 nm to 50 nm.

Figure 8D:
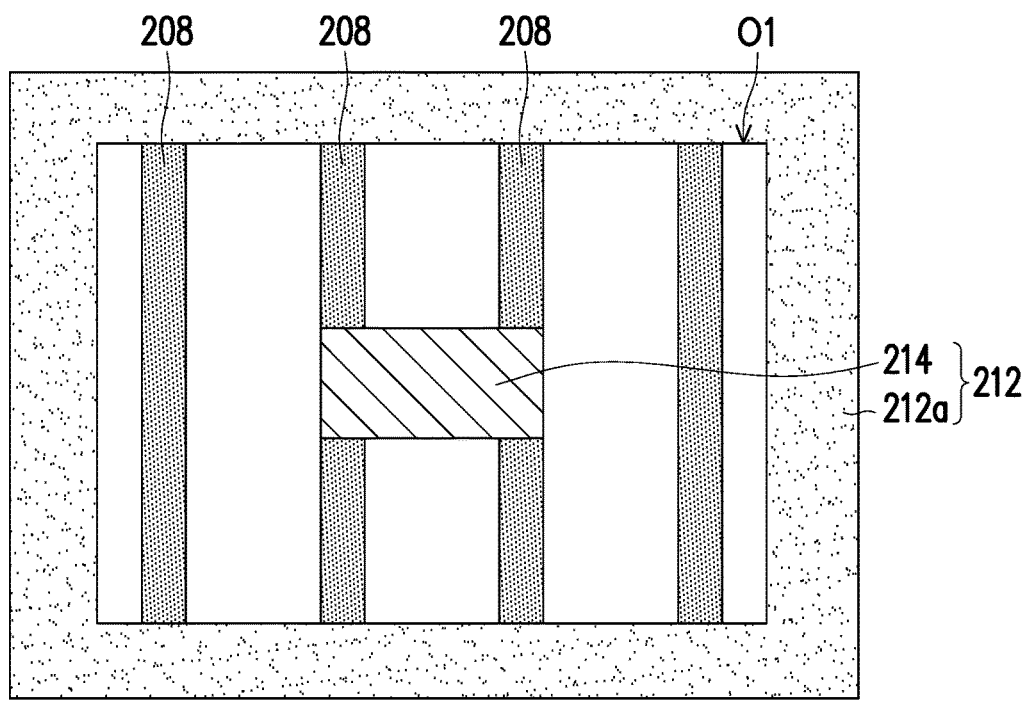

Referring to FIG. 8C and FIG. 8D, a third etching process is performed by using the first mask layer 212 as a mask to remove the strips A 206 and the strips C 210 exposed by the first opening O1. In the present embodiment, the third etching process is similar as the second etching process, the second etching process has been described in detail in the above embodiments, and will not be repeated here.

Figure 8E:
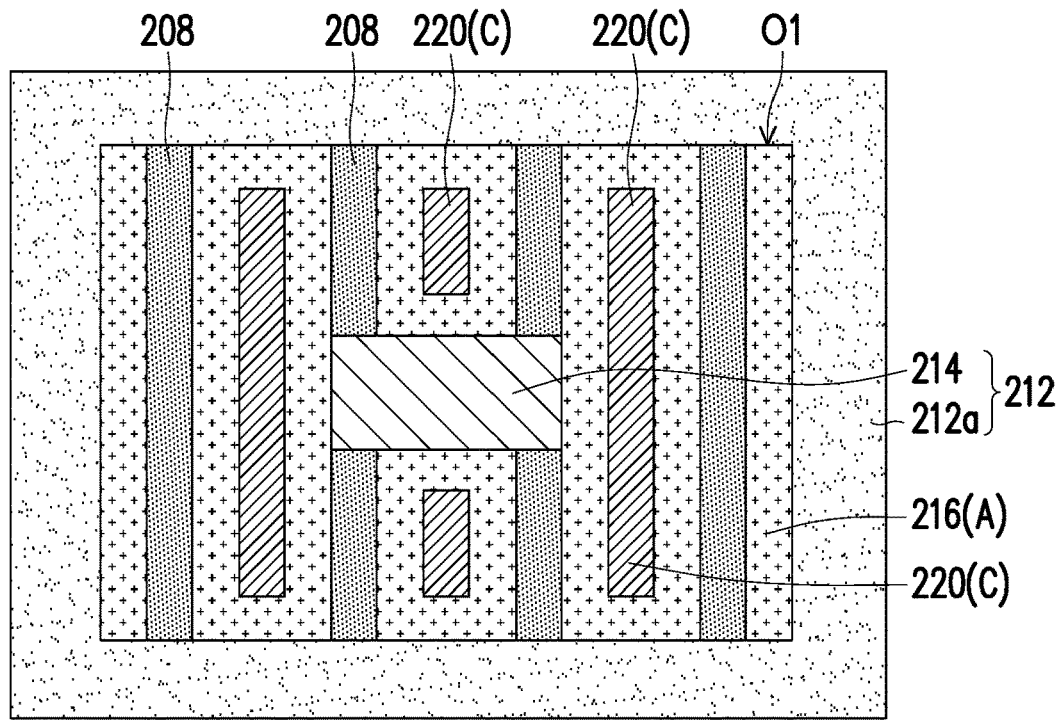

Referring to FIG. 8D and FIG. 8E, a plurality of first spacers 216 (A) are respectively formed on the sidewall of the first opening O1 and the sidewalls of the strips B 208. In the present embodiment, since the first spacer wall 216 and the strips A have the same material, the first spacer wall 216 illustrated in FIG. 8E may also be labeled as reference symbol "A". Next, after forming the first spacers 216, a plurality of second spacers 220 (C) are respectively formed on the sidewalls of the first spacer 216. In the present embodiment, since the second spacers 220 and the strips C have the same material, the second spacers 220 illustrated in FIG. 8E may also be labeled as the reference symbol "C".

Figure 8F:
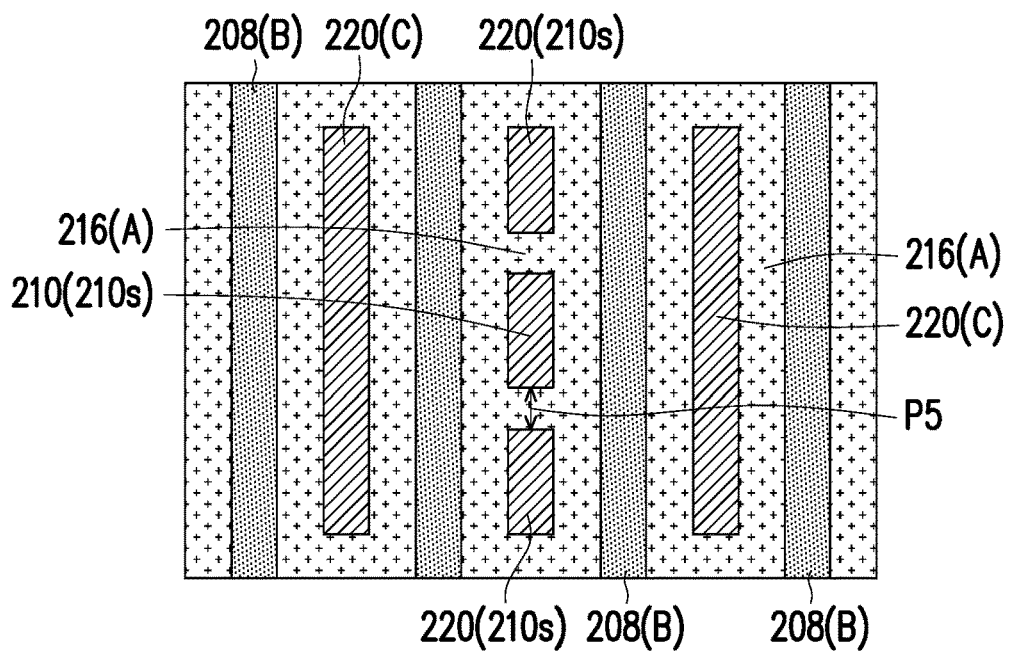

Referring to FIG. 8E and FIG. 8F, the first mask layer 212 is removed. In the case, the second spacer 220 located between two strips C 210 may be regarded as a portion of the strips C 210. That is, after performing the steps of FIG. 8A to FIG. 8F, the continuous strip C 210 of FIG. 8A is divided into a plurality of strip segments C 210s by the first spacers 216. In some embodiments, the strip segments C 210s have gaps P5 in a range of 5 nm to 10 nm. Herein, as shown in FIG. 8F, the gap P5 of the strip segments C 210s is referred to as a shortest distance of facing sides of adjacent strip C 210 and second spacer 220. It should be noted that, in the present embodiment, the gaps P5 of the strip segments C 210s are effectively formed by a quadruple-patterning (QP) method, thus the said pitches P5 can further reduce the optical limitations of the conventional lithography process, thereby achieving the effect of miniaturized semiconductor devices.

Figure 8G:
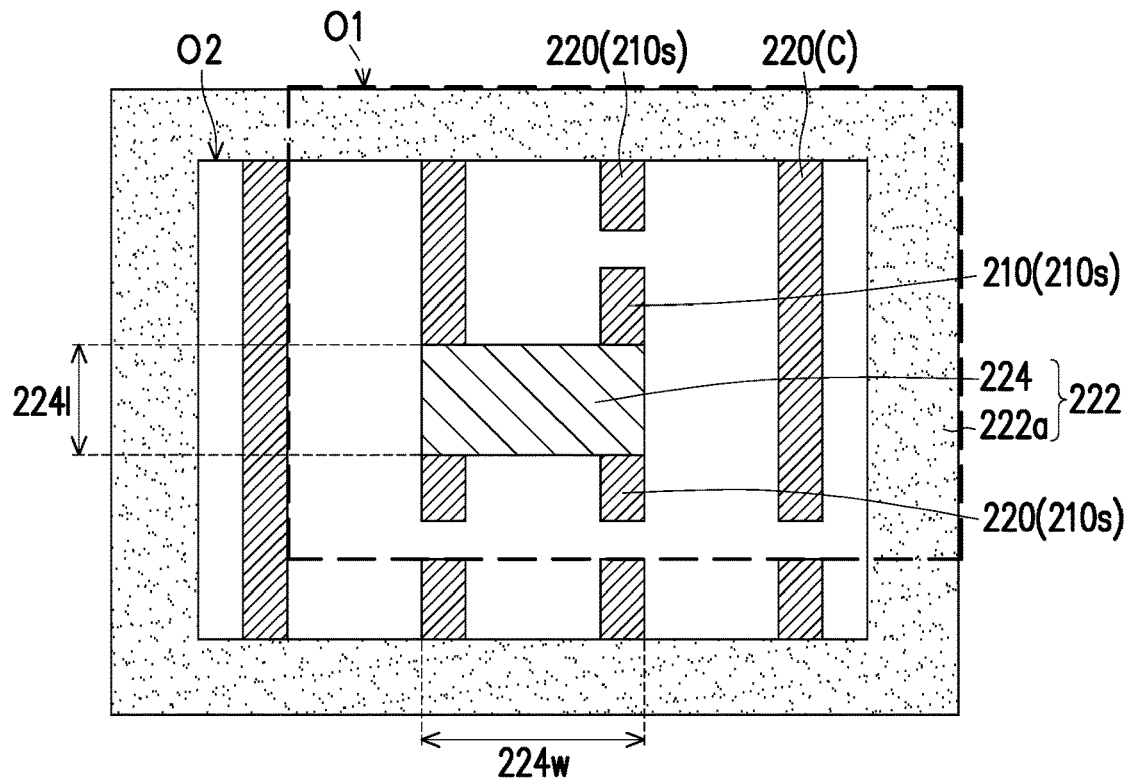

Referring to FIG. 8F and FIG. 8G, a second mask layer 222 having a second opening O2 is formed on the stripe layer 204. A fourth etching process is performed by using the second mask layer 222 as a mask to remove the first spacers 216 (A) and the strips B 208 exposed by the second opening O2. In the present embodiment, the fourth etching process is similar as the first etching process, the first etching process has been described in detail in the above embodiments, and will not be repeated here. As shown in FIG. 8G, the second opening O2 is donut-shaped. In the present embodiment, the second opening O2 is offset from the first opening O1, so that the subsequent formed strip segments B 208s (shown in FIG. 8I) and the strip segments C 210s are disposed in the staggered manner. In the case, as shown in FIG. 8G, a fourth sacrificial spacer 224 of the second mask layer 222 covers at least one pitch P5. Specifically, the step of forming the second opening O2 having the donut shape includes: forming a second initial mask layer 222a having a second initial opening; forming a third sacrificial spacer on a sidewall of the second initial opening; forming a fourth sacrificial spacer 224 on a sidewall of the third sacrificial spacer; and removing the third sacrificial spacer to expose the underlying stripe layer 204. In the case, the fourth sacrificial spacer 224 and the second initial mask layer 222a constitute the second mask layer 222 with the donut opening O2. In some embodiments, the fourth sacrificial spacer 224 and the second initial mask layer 222a may have the same material or different materials. In the present embodiment, a material of the second initial mask layer 222a is photoresist, a material of the third sacrificial spacer may be a metal-containing material; and a material of the fourth sacrificial spacer 224 may be amorphous carbon or spin-on carbon. In alternative embodiments, the third sacrificial spacer and the fourth sacrificial spacer 224 may have different materials or materials that may have different etching selectivities. In some embodiments, a length 2241 of the fourth sacrificial spacer 224 is 15 nm to 30 nm, and a width 224w of the fourth sacrificial spacer 224 is 25 nm to 50 nm.

Figure 8H:
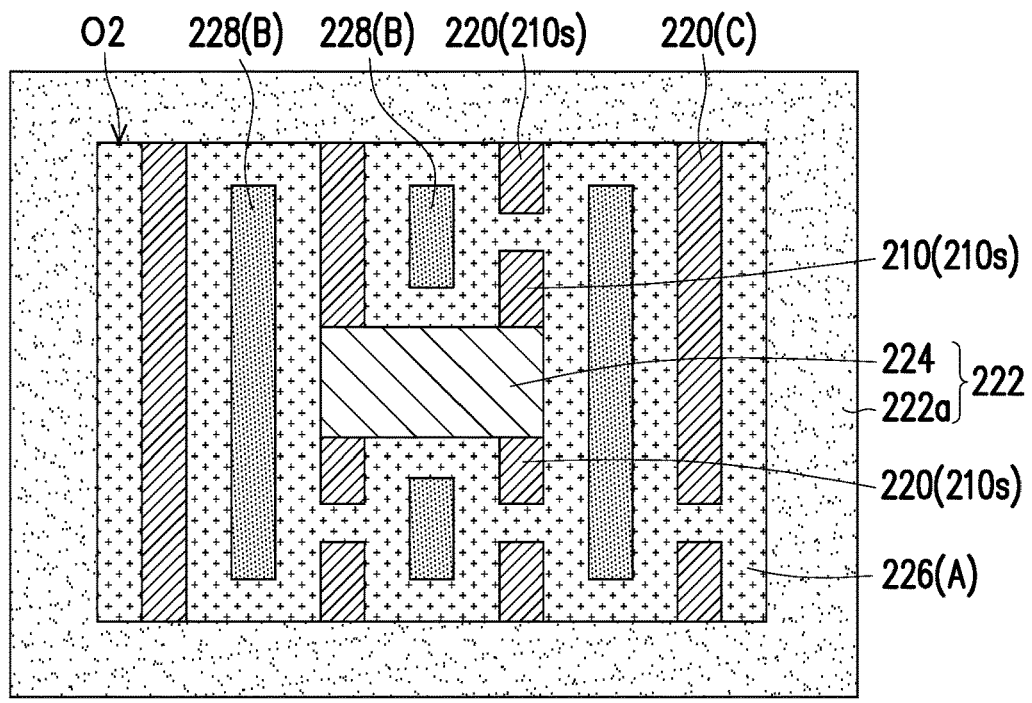

Referring to FIG. 8G and FIG. 8H, a plurality of third spacers 226 (A) are respectively formed on the sidewall of the second opening O2 and the sidewalls of the strips C (second spacers) 220. In the present embodiment, since the third spacers 226 and the strips A have the same material, the third spacers 226 illustrated in FIG. 8H may also be labeled as the reference symbol "A". Next, after forming the third spacers 226, a plurality of fourth spacers 228 (B) are respectively formed on the sidewalls of the third spacers 226. In the present embodiment, since the fourth spacers 228 and the strips B have the same material, the fourth spacers 228 illustrated in FIG. 8H may also be labeled as the reference symbol "B".

Figure 8I:
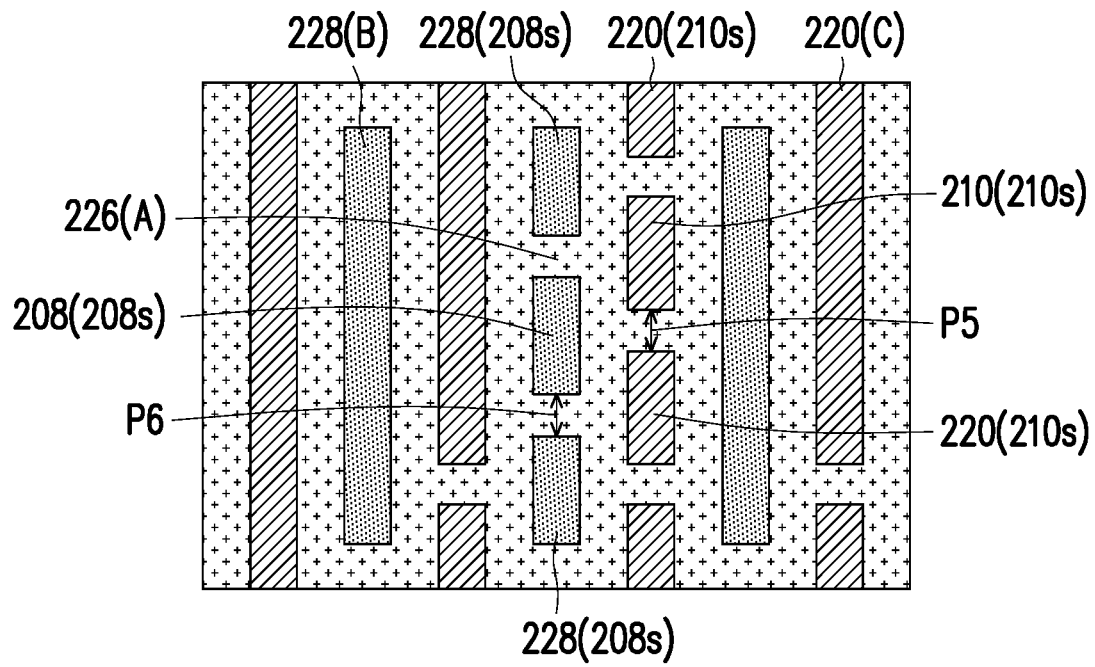

Referring to FIG. 8H and FIG. 8I, the second mask layer 222 is removed. In the case, the strip B 208 is located between two fourth spacers 228 and the fourth spacers 228 may be regarded as a portion of the strips B 208. That is, after performing the steps of FIG. 8F to FIG. 8I, the continuous strip B 208 of FIG. 8F is divided into a plurality of strip segments B 208s by the third spacers 226. In some embodiments, the strip segments B 208s have gaps P6 in a range of 5 nm to 10 nm. Herein, as shown in FIG. 8I, the gaps P6 of the strip segments B 208s is referred to as a shortest distance of facing sides of adjacent strip B 208 and fourth spacer 228. It should be noted that, in the present embodiment, the gaps P6 of the strip segments B 208s are also formed by a quadruple-patterning (QP) method, so the said gaps P6 can further reduce the optical limitations of the conventional lithography process, thereby achieving the effect of miniaturized semiconductor devices.

Figure 8J:
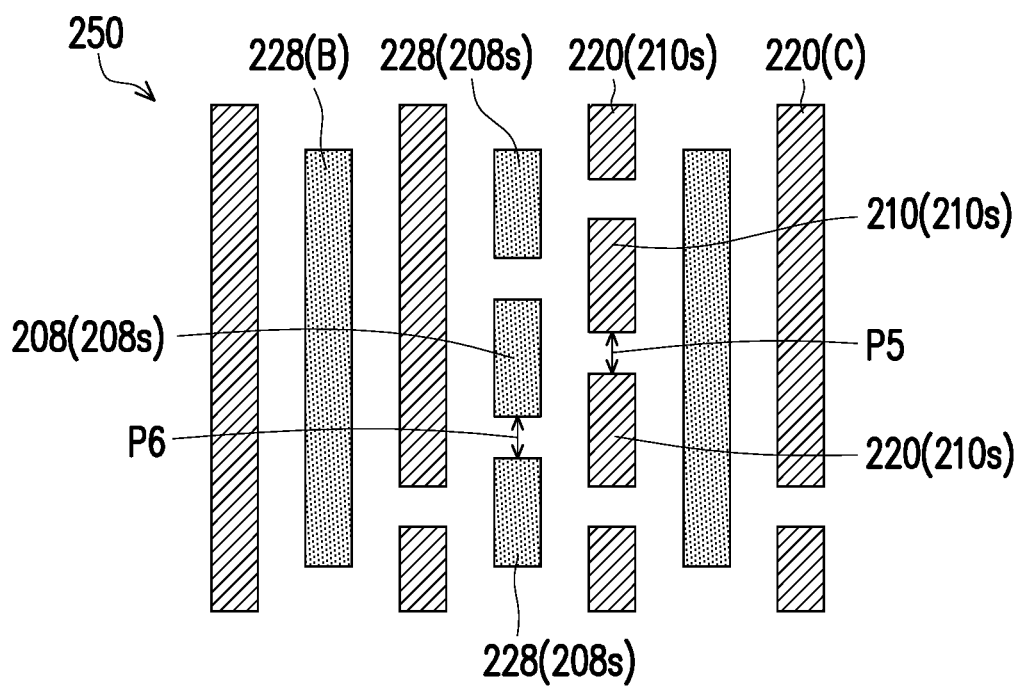

Referring to FIG. 8I and FIG. 8J, the strip A, the first spacers, and the third spacers (A) are removed to form a pattern layer 250. It should be noted that, in the present embodiment, a quadruple-patterning (QP) method is used to cut off the strips B or the strips C, thereby forming the pattern layer 250. The pattern layer 250 may be used to pattern an underlying target layer to form various semiconductor structures, such as active areas (AA), landing pads, contact structures, interconnect structures, or a combination thereof. In the case, the patterning method of the present embodiment can further enhance the integration density of the semiconductor structure. As before, the cut is self-aligned, and hence will not damage pre-existing features due to overlay errors.

FIG. 9A to FIG. 9D are schematic top views of a manufacturing process of a semiconductor structure according to a fourth embodiment of the invention.

Figure 9A:
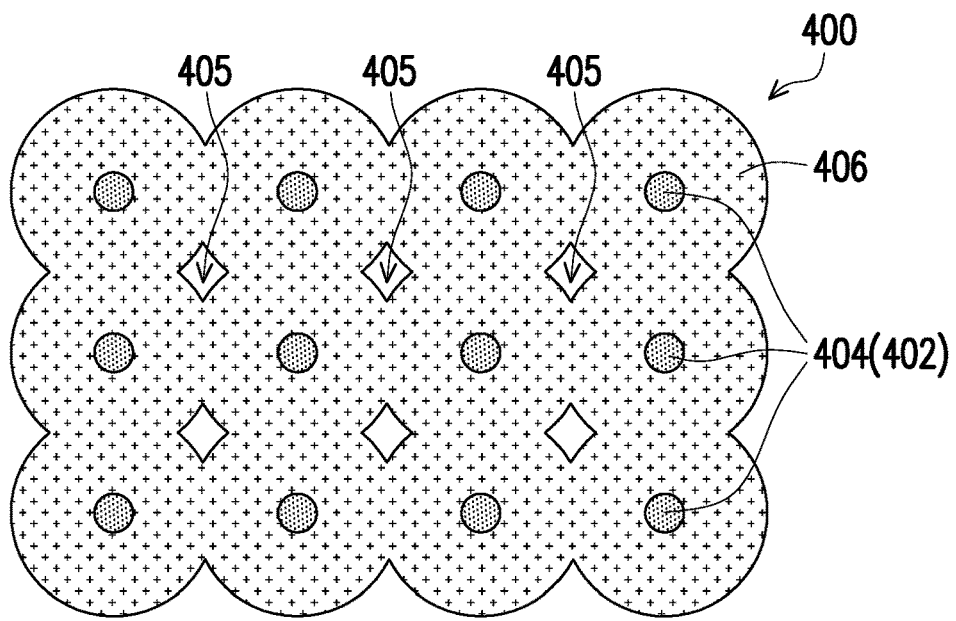
FIG. 9A to FIG. 9D are schematic top views of a manufacturing process of a semiconductor structure according to a fourth embodiment of the invention.

Referring to FIG. 9A, a core layer 402 is formed on a target layer 400. In some embodiments, the core layer 402 includes a plurality of first pillar structures 404 arranged in a rectangular or square lattice configuration. However, the present invention is not limited thereto. In other embodiments, the first pillar structures 404 may also be arranged in a hexagonal closed packing (HCP) configuration. Next, a spacer 406 is formed on sidewalls of the first pillar structures 404. Since a distance between the first pillar structures 404 along a diagonal direction is relatively long, a plurality of first holes 405 may be formed between the first pillar structures 404. In some embodiments, as shown in FIG. 9A, compared to the first columnar structure 404 having a circular pattern, the first holes 405 are a diamond shape or a diamond-like shape.

Figure 9B:
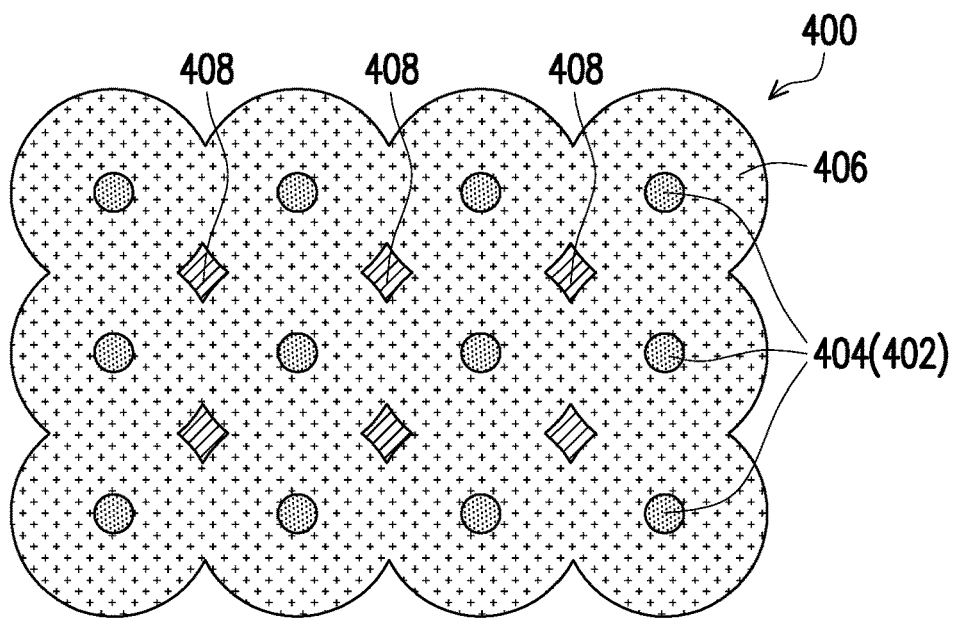

Referring to FIG. 9A and FIG. 9B, the first material is formed to fill into the first holes 405, so as to form a plurality of second pillar structures 408. In some embodiments, the first material includes a conductive material, such as a polysilicon material or a metal material.

Figure 9C:
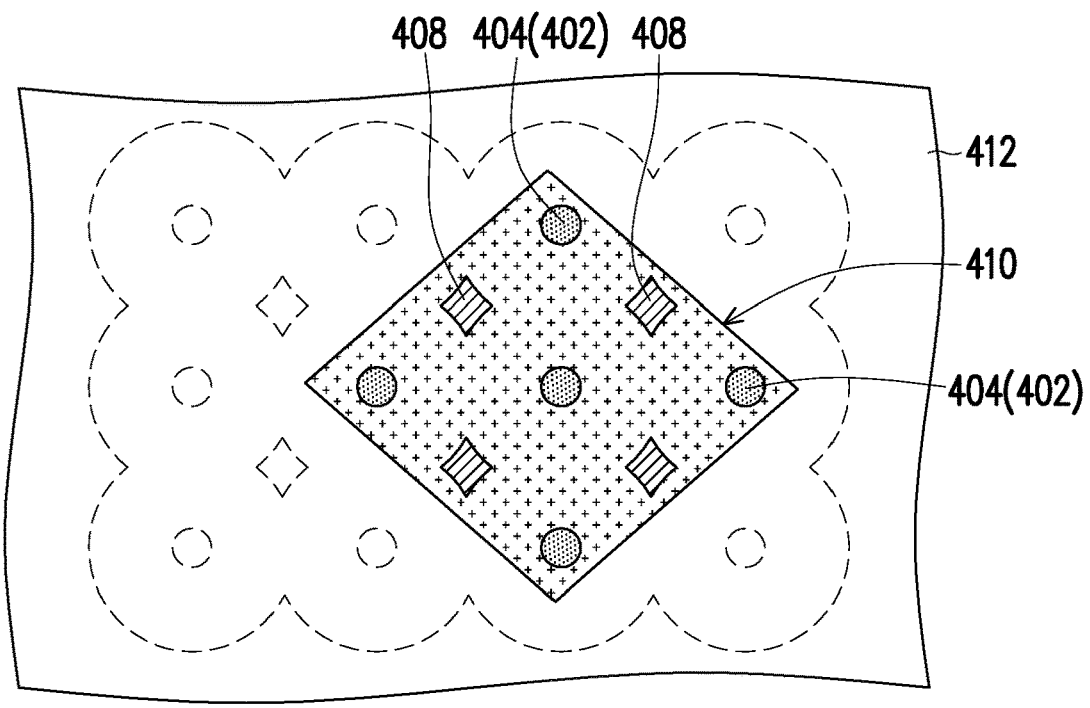

Referring to FIG. 9B and FIG. 9C, a mask layer 412 having an opening 410 is formed on the core layer 402, the spacer 406 and the second pillar structures 408. The opening 410 exposes a portion of the first pillar structures 404, a portion of the spacer 406, and a portion of the second pillar structures 408.

Figure 9D:
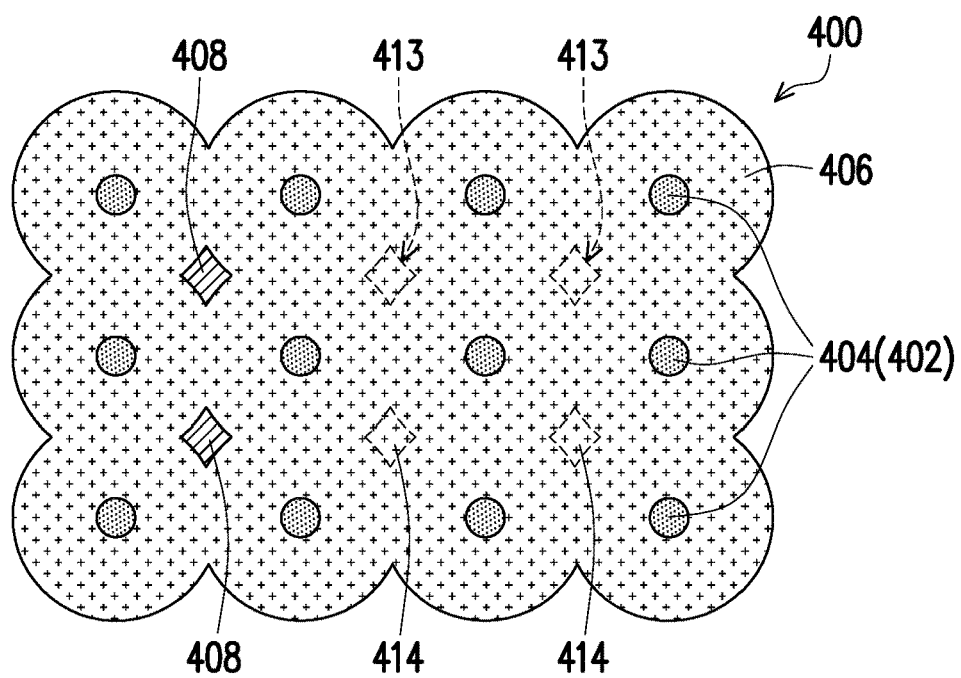

Referring to FIG. 9C and FIG. 9D, the second pillar structures 408 exposed by the opening 410 is removed to form a plurality of second holes 413. After removing the mask layer 412, a second material is formed to fill into the second hole 413, so as to form a plurality of third pillar structures 414. In some embodiments, the second material includes an insulating material, such as silicon oxide, silicon nitride, silicon oxynitride, or a combination thereof. In the present embodiment, the third pillar structures 414 and the spacer 406 may have the same material, such as silicon oxide.

Figure 10A:
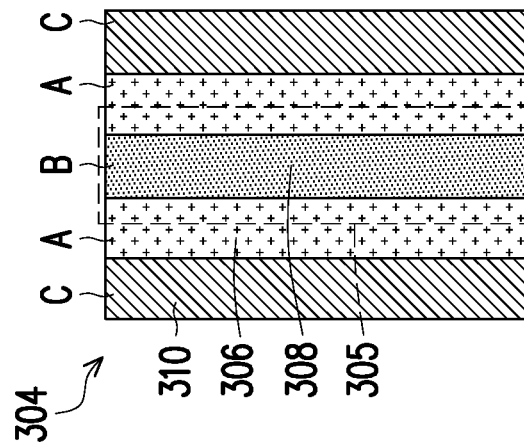
FIG. 10A to FIG. 10C are schematic top views of a manufacturing process of a semiconductor structure according to a fifth embodiment of the invention.
Figure 10B:
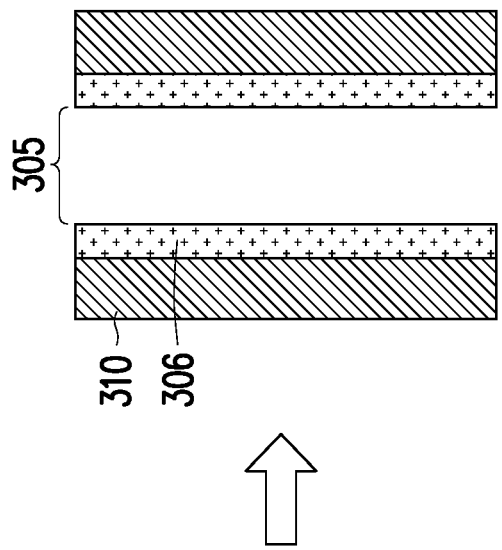
Figure 10C:
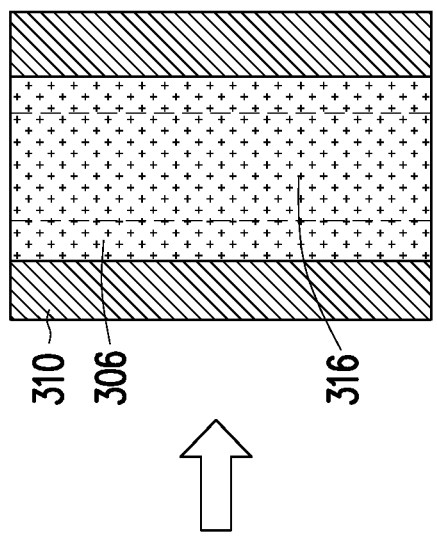

FIG. 10A to FIG. 10C are schematic top views of a manufacturing process of a semiconductor structure according to a fifth embodiment of the invention.

Referring to FIG. 10A, first, a strip layer 304 is provided. The strip layer 304 of FIG. 10A is similar to the strip layer 104 of FIG. 1A, and includes a plurality of strips A 306, a plurality of strips B 308, and a plurality of strips C 310 extending along the Y direction and alternately arranged in the order of C-A-B-A along the X direction. In the present embodiment, the materials and manufacturing methods of the strips A 306, the strips B 308, and the strips C 310 are similar to the materials and manufacturing methods of strips A 106, the strips B 108, and the strips C 110, and are not repeated here.

Referring to FIGS. 10A and 10B, the strip B 308 and a portion of the strips A 306 on both sides of the strip B 308 are removed to form an opening 305 in the strip layer 304.

Referring to FIG. 10C, a spacer 316 is formed in the opening 305. In the present embodiment, since the spacer 316 and the strips A 306 have the same material, the first spacer 316 and the strips A 306 illustrated in FIG. 10C may be referred to as a continuous structure and there is no interface therebetween (represented by a dotted line). The gap between features 310 may therefore be widened.

FIG. 11A to FIG. 11D are schematic top views of a manufacturing process of a semiconductor structure according to a sixth embodiment of the invention.

Referring to FIG. 11A, first, a strip layer 404 is provided. The strip layer 404 of FIG. 11A is similar to the strip layer 104 of FIG. 1A, and includes a plurality of strips A 406, a plurality of strips B 408, and a plurality of strips C 410 extending along the Y direction and alternately arranged in the order of C-A-B-A along the X direction. In the present embodiment, the materials and manufacturing methods of the strips A 406, the strips B 408, and the strips C 410 are similar to the materials and manufacturing methods of strips A 106, the strips B 108, and the strips C 110, and are not repeated here.

Referring to FIGS. 11A and 11B, the strip B 408 and the strips A 406 on both sides of the strip B 408 are removed to form an opening 405 in the strip layer 04. In one embodiment, as shown in FIG. 11A, the opening 405 may be enlarged to a portion of the strips C 410 on both sides of the strips A 406.

Referring to FIGS. 11B and 11C, a first spacer 416 is formed on a sidewall of the opening 405. In the case, as shown in FIG. 11C, the first spacer 416 is annular and connected to each other to form a gap 415. In the present embodiment, the first spacer 416 and the strips A 406 may have the same material.

Referring to FIGS. 11C and 11D, a second spacer 418 is formed on a sidewall of the first spacer 416. From another perspective, a spacer material is formed to fill into the gap 415 to form the second spacers 418. In some embodiments, the second spacers 418 and the strips B 408 have the same material. The inclusion of the second spacer 418 enables a narrower gap than shown in FIG. 10C.

In the present embodiment, a portion of the second pillar structures 408 may be replaced with the third pillar structures 414, so as to effectively remove the originally placed pillar structures at those locations, thereby making the design of the mask pattern more flexible.

In summary, in the embodiment of the present invention, respectively removing two strips with different materials in a specific area and performing a double-patterning process may generate high-resolution features, thereby improving the integration density of the semiconductor device. In addition, in another embodiment of the present invention, a continuous strip may be cut into a plurality of strip segments by quadruple-patterning (QP) process, thereby achieving the effect of miniaturizing the semiconductor device. The cuts are self-aligned, thereby avoiding damage to pre-existing features resulting from overlay errors. Further, in other embodiments of the present invention, a portion of the conductive pillars may be replaced with insulating pillars by performing a double-patterning (DP) process and removing the pillar structures in a specific area, thereby making the design of the mask pattern more flexible.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A patterning method, comprising:
    sequentially forming a hard mask layer and a strip layer on a target layer, wherein the strip layer comprises a plurality of strips A, in combination with a plurality of strips B and strips C arranged alternately between the strips A;
    forming a first mask layer having a first opening on the strip layer;
    removing the strips A and B exposed by the first opening;
    after removing the first mask layer, forming a plurality of first spacers on sidewalls defined by the first opening;
    forming a plurality of second spacers on sidewalls of the first spacers respectively;
    forming a second mask layer having a second opening on the strip layer;
    removing the strips A and C exposed by the second opening;

after removing the second mask layer, forming a plurality of third spacers on the sidewalls defined by the second opening;

forming a plurality of fourth spacers on sidewalls of the third spacers respectively; and removing the strips A, the first spacers, and the third spacers to form a pattern layer that exposes a top surface of the hard mask layer.

2. The patterning method according to claim 1, wherein the strips A, B, and C are arranged in the order of B-A-C-A-B-A-C-A along a direction parallel to a top surface of the target layer.

3. The patterning method according to claim 1, wherein the strips A, B, and C have different etching selectivities.

4. The patterning method according to claim 1, wherein the strips A have a same material or a material with a same etching selectivity as the first and third spacers.

5. The patterning method according to claim 1, wherein the strips B have a same material or a material with a same etching selectivity as the second and fourth spacers.

6. The patterning method according to claim 1, wherein after forming the second spacers, the strips B are divided into a plurality of strip segments B by the first spacers, and the strip segments B have a gap in a range of 10 nm to 20 nm.

7. The patterning method according to claim 6, wherein after forming the fourth spacers, the strips C are divided into a plurality of strip segments C by the third spacers, and the strip segments C have a gap in a range of 10 nm to 20 nm.

8. The patterning method according to claim 7, wherein the first opening is partially overlapped with the second opening, so that the strip segments B and C are disposed in a staggered manner.

9. The patterning method according to claim 1, further comprising:

removing a portion of the hard mask layer by using the pattern layer as a mask, so as to form a mask pattern;

removing a portion of the target layer by using the mask pattern as a mask, so as to form a plurality of third openings in the target layer; and filling the third openings with an isolation material to form a plurality of isolation structures in the target layer.

10. The patterning method according to claim 1, wherein the hard mask layer comprises a first hard mask and a second hard mask on the first hard mask, the first hard mask and the second hard mask have different materials or materials with different etching selectivities.

11. A patterning method, comprising:

providing a strip layer, wherein the strip layer comprises a plurality of strips A, a plurality of strips B, and a plurality of strips C arranged alternately;

forming a first mask layer having a first opening on the strip layer, wherein the first opening is donut-shaped;

removing the strips A and C exposed by the first opening;

forming a plurality of first spacers on sidewalls of the first opening and strips B respectively;

forming a plurality of second spacers on sidewalls of the first spacers respectively;

after removing the first mask layer, forming a second mask layer having a second opening on the strip layer, wherein the second opening is donut-shaped;

removing the strips A and B exposed by the second opening;

forming a plurality of third spacers on sidewalls of the second opening and strips C respectively;

forming a plurality of fourth spacers on sidewalls of the third spacers respectively; and after removing the second mask layer, removing the strips A, the first spacers, and the third spacers to form a pattern layer.

12. The patterning method according to claim 11, wherein forming the first opening having the donut shape comprises:

forming a first initial mask with a first initial opening;

forming a first sacrificial spacer on a sidewall of the first initial opening;

forming a second sacrificial spacer on a sidewall of the first sacrificial spacer; and removing the first sacrificial spacer to expose the underlying strip layer.

13. The patterning method according to claim 11, wherein forming the second opening having the donut shape comprises:

forming a second initial mask with a second initial opening;

forming a third sacrificial spacer on a sidewall of the second initial opening;

forming a fourth sacrificial spacer on a sidewall of the third sacrificial spacer; and removing the third sacrificial spacer to expose the underlying strip layer.

14. The patterning method according to claim 11, wherein the strips A, B, and C are arranged in the order of A-B-A-C-A-B-A-C.

15. The patterning method according to claim 11, wherein the strips A, B, and C have different etching selectivities.

16. The patterning method according to claim 11, wherein after forming the second spacers, the strips C are divided into a plurality of strip segments C by the first spacers, and the strip segments C have a gap in a range of 5 nm to 10 nm.

17. The patterning method according to claim 16, wherein after forming the fourth spacers, the strips B are divided into a plurality of strip segments B by the third spacers, and the strip segments B have a gap in a range of 5 nm to 10 nm.

18. The patterning method according to claim 17, wherein the first opening is offset from the second opening, so that the strip segments B and C are disposed in a staggered manner.

19. A patterning method, comprising:

forming a core layer on a target layer, wherein the core layer comprises a plurality of first pillar structures arranged in rectangular or square lattice configuration;

forming a spacer on sidewalls of the first pillar structures to form a plurality of first holes between the first pillar structures;

filling the first holes with a first material to form a plurality of second pillar structures;

forming a mask layer with an opening on the core layer;

removing the second pillar structures exposed by the opening to form a plurality of second holes; and filling the second holes with a second material to form a plurality of third pillar structures.

20. The patterning method according to claim 19, wherein the first and second materials have different materials, the first material comprises a conductive material, and the second material comprises an insulating material.

* * * * *